United States Patent
Lee et al.

(10) Patent No.: US 9,159,497 B2
(45) Date of Patent: Oct. 13, 2015

(54) LOW BAND GAP COPOLYMER AND METHOD FOR MANUFACTURING SAME

(71) Applicant: GWANGJU INSTITUTE OF SCIENCE AND TECHNOLOGY, Gwangju (KR)

(72) Inventors: Jae-Suk Lee, Gwangju (KR); Ashraf A El-Shehawy, Gwangju (KR); Joon-Keun Min, Gwangju (KR); Abdo Nabiha Ibrahim Mahmoud Mahamed, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 14/130,294

(22) PCT Filed: Nov. 20, 2012

(86) PCT No.: PCT/KR2012/009834
§ 371 (c)(1),
(2) Date: Dec. 30, 2013

(87) PCT Pub. No.: WO2013/077613
PCT Pub. Date: May 30, 2013

(65) Prior Publication Data
US 2014/0135460 A1 May 15, 2014

(30) Foreign Application Priority Data

Nov. 21, 2011 (KR) .................. 10-2011-0121364

(51) Int. Cl.
*C08G 75/00* (2006.01)
*H01G 9/042* (2006.01)
(Continued)

(52) U.S. Cl.
CPC ............. *H01G 9/042* (2013.01); *C08G 61/122* (2013.01); *C08G 61/123* (2013.01); *C08G 61/126* (2013.01); *H01L 29/786* (2013.01); *H01L 51/0036* (2013.01); *H01L 51/0037* (2013.01); *H01L 51/0043* (2013.01);
(Continued)

(58) Field of Classification Search
CPC .. C08G 61/122; C08G 61/126; C08F 234/04; H01L 51/0036; H01L 51/0043; H01L 51/0545; H01L 51/4226
USPC ........................... 528/377, 380; 526/171, 256
See application file for complete search history.

(56) References Cited

U.S. PATENT DOCUMENTS

2003/0186079 A1* 10/2003 Towns et al. .................. 428/690
2008/0262183 A1* 10/2008 Lehmann .......................... 528/7
(Continued)

FOREIGN PATENT DOCUMENTS

WO      02096970 A1    12/2002
WO   2009070706 A2    6/2009

OTHER PUBLICATIONS

Lee et al. (Eur. J. Org. Chem. 2011, 4841-4852).*
(Continued)

*Primary Examiner* — Shane Fang
(74) *Attorney, Agent, or Firm* — Hauptman Ham, LLP

(57) ABSTRACT

Disclosed herein are a copolymer having a low band gap and a preparing method thereof, and more specifically, a copolymer having a low band gap and other various and excellent physical properties, and a preparing method thereof.

11 Claims, 11 Drawing Sheets

(51) Int. Cl.
  *C08G 61/12* (2006.01)
  *H01L 51/00* (2006.01)
  *H01L 29/786* (2006.01)
  *H01L 51/05* (2006.01)
  *H01L 51/42* (2006.01)

(52) U.S. Cl.
  CPC . *C08G 2261/124* (2013.01); *C08G 2261/1412* (2013.01); *C08G 2261/1424* (2013.01); *C08G 2261/3223* (2013.01); *C08G 2261/3246* (2013.01); *C08G 2261/364* (2013.01); *C08G 2261/414* (2013.01); *C08G 2261/91* (2013.01); *C08G 2261/92* (2013.01); *H01L 51/0545* (2013.01); *H01L 51/4226* (2013.01); *Y02E 10/549* (2013.01)

(56) References Cited

U.S. PATENT DOCUMENTS

| | | | |
|---|---|---|---|
| 2009/0107543 | A1 | 4/2009 | Han-Adebekun et al. |
| 2009/0227763 | A1* | 9/2009 | Sensfuss et al. ............ 528/378 |
| 2009/0236979 | A1 | 9/2009 | Han-Adebekun et al. |

OTHER PUBLICATIONS

Abdo et al. (Eur. J. Org. Chem. 2012, 5540-5551).*
Sonar et al. (J. Mater. Chem., 2011, 21, 10532-10541).*
Kumar et al. Polym. Chem., 2010, 1, 286-288.*
Christel Gozzi et al., Direct thiophene arylation catalysed by Palladium, journal, 1997, pp. 8867-8870, vol. 38, No. 51, Tetrahedron Letters, UK.
Toru Okazawa et al., Palladium-Catalyzed Multiple Arylation of Thiophenes, journal, Apr. 20, 2002, pp. 5286-5287, vol. 124, Journal of American Chemical Society, US.
Bobby Glover et al., Regioselective Palladium-Catalyzed Arylation of 3-Carboalkoxy Furan and Thiophene, journal, Jan. 11, 2003, pp. 301-304, vol. 5, No. 3, Organic Letters, US.
Aya Yokooji et al., Synthesis of 5,50-diarylated 2,20-bithiophenes via palladium-catalyzed arylation reactions, journal, Jun. 15, 2004, pp. 6757-6763, vol. 60, Tetrahedron, US.
International Search Report mailed Mar. 28, 2013 for PCT/KR2012/009834, citing the above reference(s).

* cited by examiner

P1　　　　P4　　　　P3　　　　P6

LOW BAND GAP COPOLYMER AND METHOD FOR MANUFACTURING SAME

CROSS REFERENCE TO RELATED APPLICATION

This application claims the priority of Korean Patent Application No. 10-2011-0121364, filed on Nov. 21, 2011 in the Korean Patent and Trademark Office. Further, this application is the National Phase application of International Application No. PCT/KR2012/009834 filed on Nov. 20, 2012, which is incorporated herein by reference in its entirety.

TECHNICAL FIELD

The present invention relates to a copolymer having a low band gap and a preparing method thereof.

BACKGROUND ART

In these days, preparation of a π-conjugated polymer has received much attention due to promising optical and electronic properties, in developing novel organic optoelectronic materials. Research into a mixture of poly(3-hexylthiophene) (P3HT) and [6,6]-phenyl C61 butyric acid methylester (PCBM) used as standard electron donor and electron acceptor materials in bulk hetero junction (BHJ) solar cells (1,2), respectively, has been conducted for the last twenty years, thereby achieving an appreciation regarding Device Physics and improving power conversion efficiency (PCE) to 4 to 5%. However, efficiency of a P3HT/PCBM solar cell is limited by a relatively large band gap of P3HT (~1.90 eV).

Recently, donor-acceptor of the conjugated copolymer has been extensively used as a donor polymer having a low band ga6pin other organic electronic materials as well as organic solar cells. Significant efforts have been presently focused on finding novel combinations in donor-acceptor units capable of increasing the PCE up to about 10%. Benzothiadiazole (BT) is one of the most promising acceptor units capable of inducing a low band gap. Even though the BT structure has low solubility, several copolymers of electron-abundant units (donor) and BT capable of improving processability were irradiated, which show high PCE at the maximum of 6.1%. Recently, it has been reported that a series of alternate π-conjugated copolymers consisting of BT and different number of hexylthiophene (HT) units are synthesized and characterized, wherein introduction of BT into the poly-HT chain has a significant influence on processability as well as opticophysical and electrochemical properties. Therefore, a co-monomer of 4,7-bis(3,3'/4,4'-hexylthiophene-2-yl)benzo[c][2,1,3]thiadiazole(HT-BT-HT) has received attention as a building block for constituting a low band gap copolymer having a high degree of processability.

Meanwhile, in new organic conductive material fields, ethylenedioxythiophene (EDOT) has been used as a building block in several conjugated systems having combined unique properties such as electrochromic behavior, and the like, and low band ga6ppolymers. A simple, effective, and position-selective synthetic method is required for a bonding of the building block. An arylation method including a metal-catalyst cross coupling reaction of organic metals and organic halides is generally used. Direct and position-selective arylation of thiophene having electron-inducing groups at reactive 2- and/or 5-positions has been recently reported [(a) C. Gozzi, L. Lavenot, K. Ilg, V. Penalva, M. Lemaire, *Tetrahedron Lett.* 1997, 38, 8867-8870; (b) T. Okazawa, T. Satoh, M. Miura, M. Nomura *J. Am. Chem. Soc.* 2002, 124, 5286-5287; (c) B. Glover, K. A. Harvey, B. Liu, M. J. Sharp, M. F. Timoschenko, *Org. Lett.* 2003, 5, 301-304; (d) A. Yokooji, T. Satoh, M. Miura, M. Nomura, *Tetrahedron* 2004, 60, 6757-6763].

In addition, in thiophene having an electron withdrawing group including a methoxy group, aryl halide/heteroaryl halide may also be directly bound at 2-position and/or 5-position under 'Heck-type' experiment condition (Jeffery condition). EDPT is basically regarded as 3,4-disubstituted alkoxy thiophene, similar reactivity during an arylation reaction may be shown at 2-position and 5-position to obtain 2-substituted EDOT derivatives. A range of the reaction was successfully extended to synthesize various biaryl compounds in reasonable yields through direct and position-selective C—H arylation of EDOT under experimental conditions of 'Heck-type'. A copolymer based on EDOT may be favorably prepared by using the above-described developed methods, and thus conventional and general cross-coupling method (Kumada, Negishi, Stille, and Suzuki-type) is avoided.

In addition to an interest in synthesis of oligo- and polythiophene, in order to find a π-conjugated copolymer having a low band gap which is appropriate for a photovoltaic cell and optoelectron, several π-conjugated copolymers are prepared by binding HT-BT-HT co-monomers to other donors and/or acceptors such as 3,4-ethylenedioxythiophese (EDOT), bis-EDOT and thieno[3,4-b]pyrazine (TP) and using general a palladium-catalyst Stille cross-coupling method. Further, several EDOT-based copolymers were designed and successively prepared by direct CH-arylation of the EDOT derivative using various heteroaryl dibromide under 'Heck-type' experimental conditions, and compared with the same copolymers prepared by the Stille cross-coupling method. It is shown that positions of hexyl chains in thiophene rings having HT-BT-HT units have important influence on optophysical and electrochemical properties of the polymers.

DISCLOSURE

Technical Problem

An object of the present invention is to provide a copolymer having a low band gap and other various and excellent physical properties, and a preparing method thereof.

Technical Solution

According to an exemplary embodiment of the present invention, there is provided a copolymer represented by the following Chemical Formula 1:

  [Chemical Formula 1]

in Chemical Formula 1,
—X— is -$D_3$- or -$A_2$-;
-$D_1$-, -$D_2$- and -$D_3$- are the same or different and each independently selected from

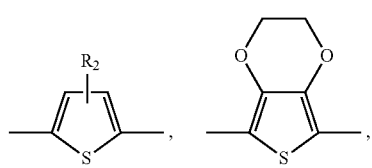

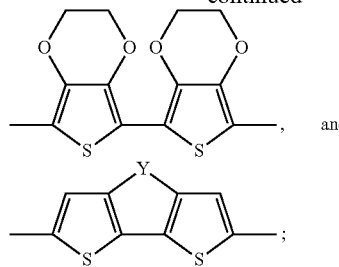

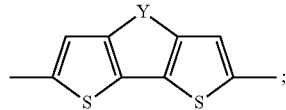

—$R_1$ is C1-C12 alkyl, C1-C12 alkoxy, amine, phenyl group;
—Y— is —C—, —N—, or —O—; -$A_1$- and -$A_2$- are the same or different and each independently selected from

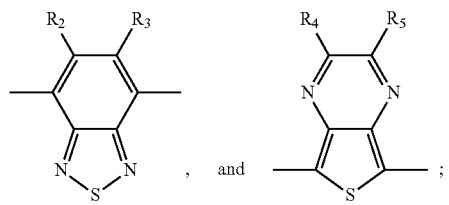

—$R_2$, —$R_3$, —$R_4$ and —$R_5$ are the same or different and each independently —H, C1-C12 alkyl, C1-C12 alkoxy, or phenyl group; and n is an integer of 10 to 10,000.

The copolymer may be represented by the following Chemical Formula 2:

     [Chemical Formula 2]

in Chemical Formula 2, $D_3$ is different from $D_1$ and $D_2$.

The copolymer may be represented by the following Chemical Formula 3:

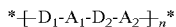     [Chemical Formula 3]

in Chemical Formula 3, $A_2$ is different from $A_1$.

According to another exemplary embodiment of the present invention, there is provided a copolymer represented by the following Chemical Formula 4:

[Chemical Formula 4]

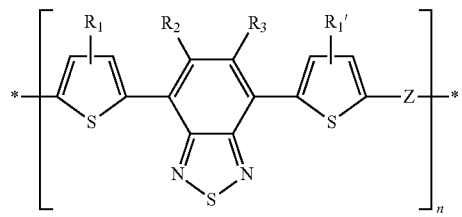

in Chemical Formula 4,

—$R_1$, —$R_2$, —$R_3$ and —$R_1'$ are the same or different and each independently hexyl, C1-C12 alkyl, phenyl, C1-C12 alkoxy, —H, amine group;

—Z— is

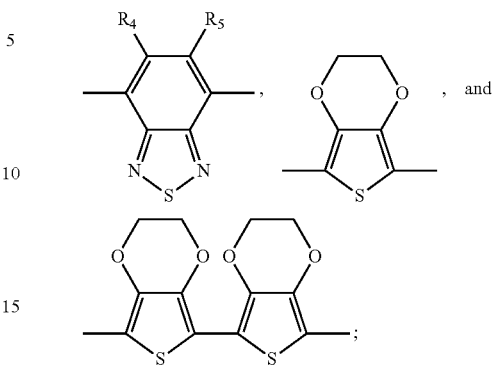

—$R_4$ and —$R_5$ are the same or different and each independently —H, C1-C12 alkyl, C1-C12 alkoxy, amine, or phenyl group; and n is an integer of 10 to 10,000.

According to another exemplary embodiment of the present invention, there is provided a copolymer represented by any one of the following Chemical Formulas 5 to 7:

[Chemical Formula 5]

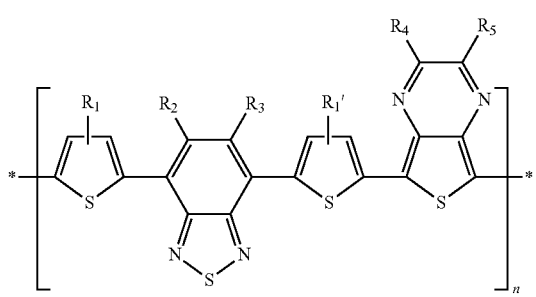

[Chemical Formula 6]

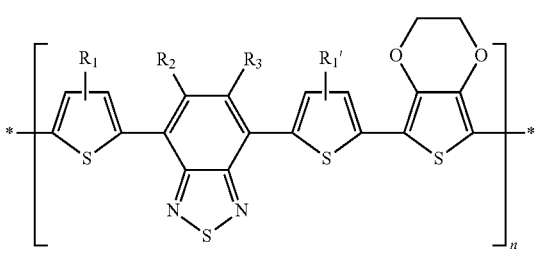

[Chemical Formula 7]

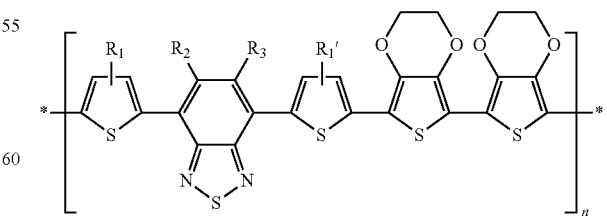

According to another exemplary embodiment of the present invention, there is provided a copolymer represented by any one of the following Chemical Formulas 8 to 10:

[Chemical Formula 8]

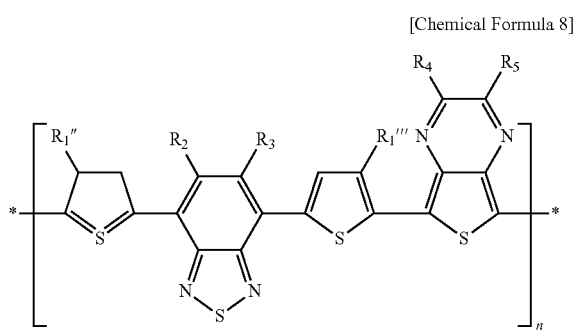

[Chemical Formula 9]

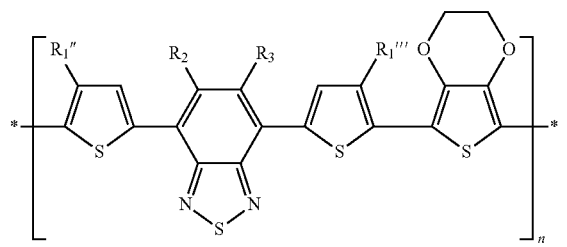

[Chemical Formula 10]

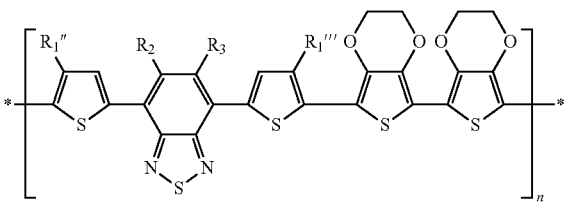

wherein —$R_1''$ and —$R_1'''$ are the same or different and each independently hexyl, C1-C12 alkyl, C1-C12 alkoxy, amine, —H or phenyl group.

According to another exemplary embodiment of the present invention, there is provided a preparing method of a copolymer represented by the following Chemical Formula 2 comprising: performing a direct CH arylation reaction on a first monomer represented by the following Chemical Formula 11 with a second monomer of $D_3$ in presence of Pd-containing catalyst, $L_1$-$D_1$-$A_2$-$D_2$-$L_2$      [Chemical Formula 11]

\*$\dashv$$D_1$-$A_1$-$D_2$-$D_3$$\dashv_n$\*      [Chemical Formula 2]

-$L_1$, and -$L_2$ are the same or different and each independently selected from —Cl, —Br and —I, -$D_1$- and -$D_2$- are the same or different, D3 is different from D1 and D2; and -$D_1$-, -$D_2$-, and $D_3$ are each independently selected from

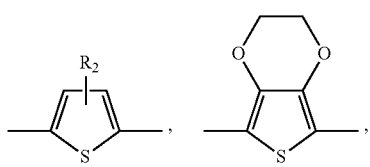

-continued

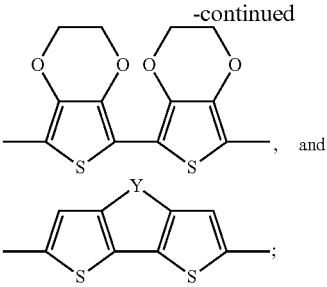
, and

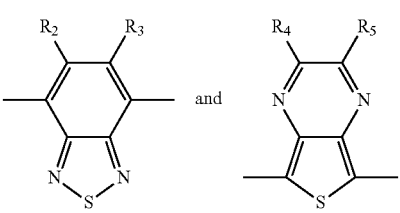
;

—$R_1$ is C1-C12 alkyl, C1-C12 alkoxy, amine, phenyl group;
—Y— is —C—, —N—, or —O—;
-$A_1$- is selected from

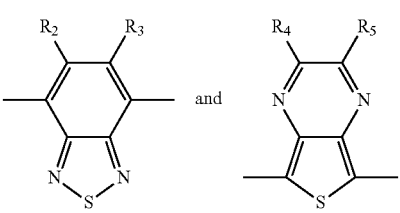

—$R_2$, —$R_3$, —$R_4$ and —$R_5$ are the same or different and each independently —H, C1-C12 alkyl, C1-C12 alkoxy, or phenyl group; and
n is an integer of 10 to 10,000.

According to another exemplary embodiment of the present invention, there is provided a preparing method of a copolymer represented by the following Chemical Formula 3 comprising: performing a direct CH arylation reaction on a first monomer represented by the following Chemical Formula 12 with a second monomer of $A_2$ in presence of Pd-containing catalyst, $L_1$-$D_1$-$A_1$-$D_2$-$L_2$      [Chemical Formula 12]

\*$\dashv$$D_1$-$A_1$-$D_2$-$A_2$$\dashv_n$\*      [Chemical Formula 3]

-$L_1$, and -$L_2$ are the same or different and each independently selected from —Cl, —Br and —I,
-$D_1$- and -$D_2$- are the same or different and each independently selected from

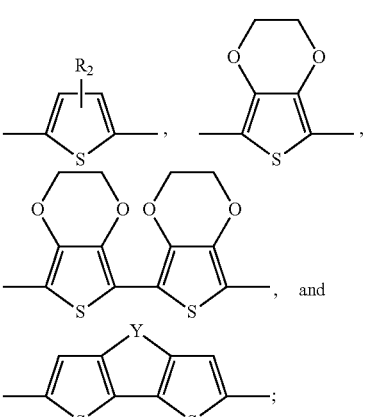

—$R_1$ is C1-C12 alkyl, C1-C12 alkoxy, amine, phenyl group;
—Y— is —C—, —N—, or —O—;

-A₁- and -A₂- are different and each independently selected from

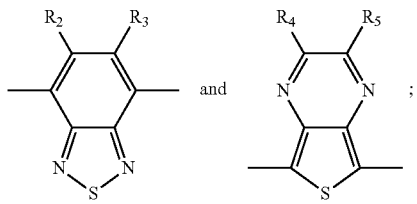

—R₂, —R₃, —R₄ and —R₅ are the same or different and each independently —H, C1-C12 alkyl, C1-C12 alkoxy, or phenyl group; and n is an integer of 10 to 10,000.

According to another exemplary embodiment of the present invention, there is provided a preparing method of a copolymer represented by the following Chemical Formula 4 comprising: performing a direct CH arylation reaction on a first monomer represented by the following Chemical Formula 13 with a second monomer selected from

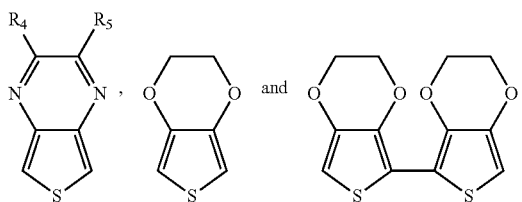

in presence of Pd-containing catalyst,

[Chemical Formula 13]

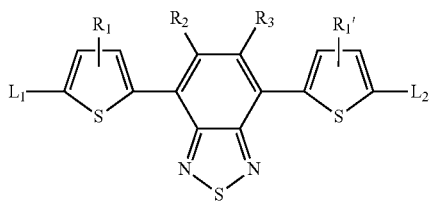

[Chemical Formula 4]

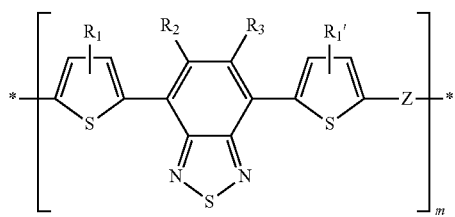

-L₁, and -L₂ are the same or different and each independently selected from —Cl, —Br and —I, —R₁, —R₂, —R₃, —R₁' are the same or different and each independently hexyl, C1-C12 alkyl, phenyl, C1-C12 alkoxy, —H, amine group;

—Z— is selected from

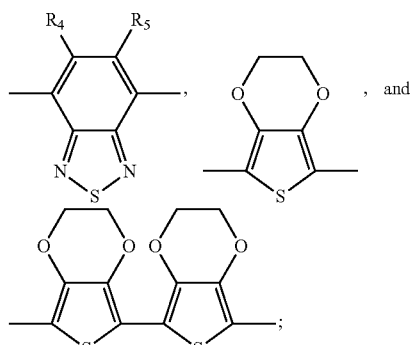

$R_4$ and $R_5$ are the same or different and each independently —H, C1-C12 alkyl, C1-C12 alkoxy, amine or phenyl group; and n is an integer of 10 to 10,000.

Advantageous Effects

The copolymer according to the present invention may be used as the π-conjugated copolymer having a low band gap and used for a photovoltaic cell, and the copolymer may be easily and effectively prepared according to the preparing method of the copolymer according to the present invention. In particular, the copolymer according to the preferred embodiment of the present invention showed excellent solubility in the most general organic solvents and significant red-shift of UV-vis absorption spectrum obtained by movement of hexyl side chains from 3,3'-position to 4,4'-position, and in particular, the optical absorption may be extended over 1000 nm, such that the optical and electrochemical band gap may be decreased to the minimum level. In addition, with the copolymer according to the preferred embodiment of the present invention, since HOMO level (−4.81 to −5.35; P6 −5.05 eV) is higher than the most air oxidation threshold (about −5.27 eV), excellent stability against oxidation may be secured, and in addition, since LUMO level (−3.28 to −3.55; P6 −3.55 eV) is higher than that of PCBM (−4.3 eV), the light-induced electron transfer to the PCBM acceptor may be easily achieved. As a result, the copolymer according to the present invention may be a promising candidate for an active material used in the most organic photovoltaic cells and optoelectronic devices due to thermally, optically, and electrochemically excellent properties.

BEST MODE

Figure 1:
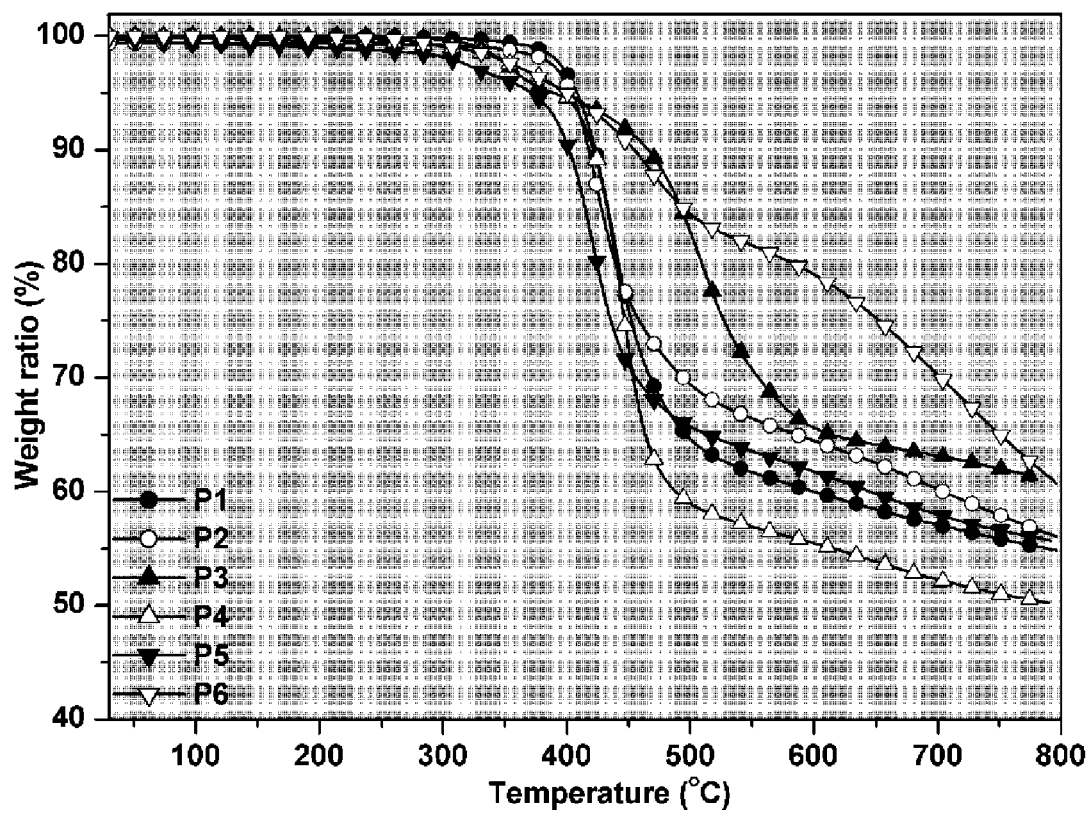
FIG. 1 shows a TGA thermogram of P1 to P6.

Hereinafter, in order to help understanding of various aspects and various embodiment of the present invention, preferable Examples will be described. However, the following Examples are provided by way of examples only and the present invention is not limited thereto.

EXAMPLE

Synthesis of Precursor-Monomer and Co-Monomer

Four precursor-co-monomers (1 to 4) of 4,7-bis(5-bromo/tributylstannyl-3/4-hexylthiophene-2-yl)benzo[c][2,1,3]thiadiazole represented by the following Chemical Formulas 1a and 1b were easily synthesized and purified by flash silica gel chromatography at a high yield. Dibromo- and di-tributylstannyl derivative structures of 4,7-bis(3,3'/4,4'-hexylthiophene-2-yl)benzo[c][2,1,3]thiadiazole are shown in the following Chemical Formulas 1a and 1b:

[Chemical Formula 1a]

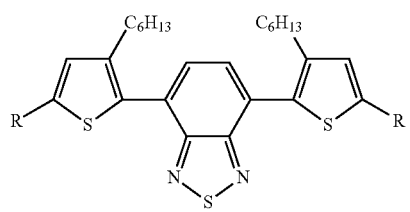

1; R = Br (91.0%)
2; R = Sn(C$_4$H$_9$)$_3$ (90.0%)

[Chemical Formula 1b]

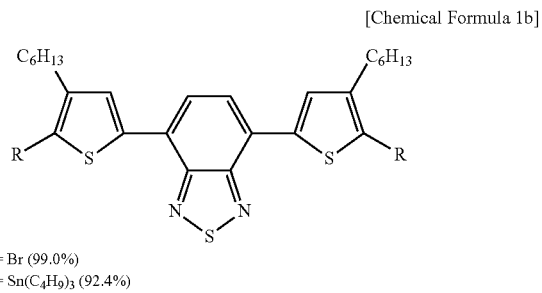

3; R = Br (99.0%)
4; R = Sn(C$_4$H$_9$)$_3$ (92.4%)

Several EDOT derivatives were prepared at a high yield according to Reaction Formula 1. EDOT 5 was lithiated with lithium diisopropylamide (LDA) at −80, followed by quenching the reaction mixture with tributyltin chloride, thereby obtaining 2,5-bis(tributylstannyl)-3,4-EDOT(6) at 92% yield. In addition, bis-EDOT 8 prepared by lithiating 7 with n-BuLi and quenching the mixture with CuCl$_2$ was lithiated with n-BuLi at −80, followed by quenching the mixture with tributyltin chloride, thereby obtaining a mixture containing mono- and di-tributyltin derivatives 8 and 9 corresponding to bis-EDOT and contained in concentration of 23% and 75%, respectively, which were easily separated by flash silica gel column chromatography. The following Reaction Formula 1 shows a synthetic route of the EDOT derivative.

[Reaction Formula 1]

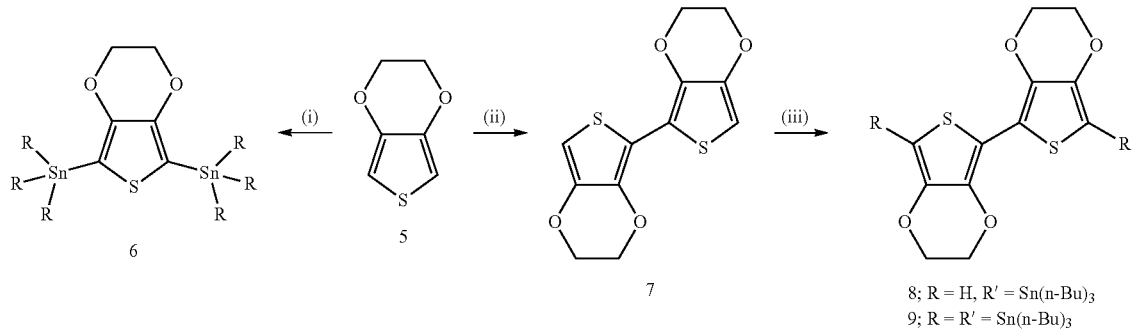

Reagents and Conditions: (i) LDA/THF, (Bu)3SnCl, 0 to room temperature; (ii) n-BuLi/THF/−80, CuCl2/−80 to −40; (iii) n-BuLi/THF/−80, (Bu)3SnCl, THF (−80 to room temperature).

Lastly, 5,7-dibromothieno[3,4-b]pyrazine (14) was prepared by processes known in literature. 2,5-dibromothiophene (10) was nitrified with a mixture of fumed HNO$_3$ and concentrated H$_2$SO$_4$ to obtain 2,5-dibromo-3,4-dinitrothiophene (11) in 61% yield (Reaction Formula 2). 11 was reduced by Sn and HCl, dihydrochloride of the obtained 3,4-diaminothiophene (12) was condensed with glyoxalate of aqueous Na$_2$CO$_3$, thereby obtaining thieno[3,4-b]pyrazine 13. 13 was brominated with NBS in a mixture (v/v; 1:1) of CHCl$_3$ and AcOH at room temperature, thereby obtaining a desired compound 14 in favorable yield. Structures of the obtained all compounds were confirmed by $^1$H— and 13C-NMR and elemental analysis. The following Reaction Formula 2 shows synthesis of 5,7-dibromothieno[3,4-b]pyrazine (14)

[Reaction Formula 2]

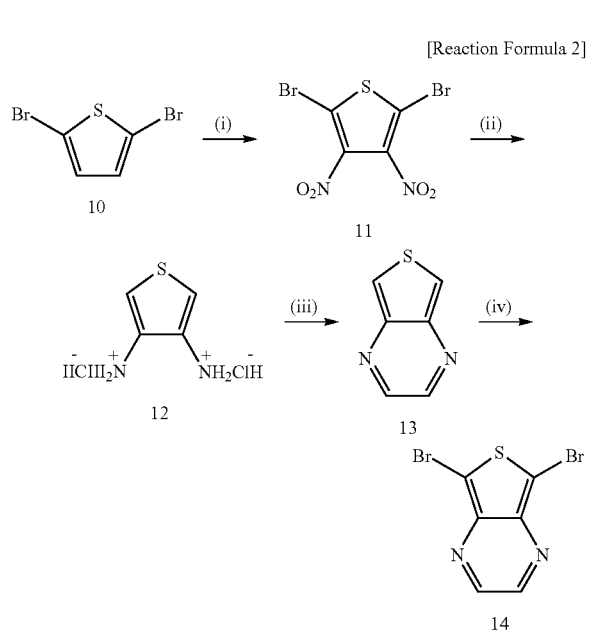

Reagents and Conditions: (i) H$_2$SO$_4$/F.H$_2$SO$_4$/F.HNO$_3$, ice-bath to room temperature, 3 h; (ii) Sn/HCl, one night, 0; (iii) aqueous glyoxal, K$_2$CO$_3$, room temperature, 3 h; (iv) NBS, AcOH/CHCl$_3$, room temperature, one night.

Example

Synthesis of Polymer (1) Method of Using Stille Cross-Coupling

A polymer using HT-BT-HT as a building-block for synthesis of π-conjugated copolymer having a wide and low band gap was firstly irradiated by generally used Pd-catalyst Stille cross-coupling method (Reaction Formula 3). A polymerization reaction was performed on N,N-dimethylformamide (DMF) in presence of Pd(PPh$_3$)$_4$ in a catalytic amount under microwave reaction condition. Copolymers P1 and P2 corresponding to Stille cross-coupling of a co-monomer 1 and di-tributylstannyl-EDOT 8 or bis-EDOT 9 in the equimolar amount were obtained in 97% and 93% yields, respectively. In the case of copolymerization of the co-monomer 3, 8 or 9 performed under the same reaction conditions, corresponding copolymers P4 and P5 were obtained in 88% and 89% yields, respectively. The following Reaction Formula 3 shows a general synthesis route for synthesizing a π-conjugated copolymer.

[Reaction Formula 3]
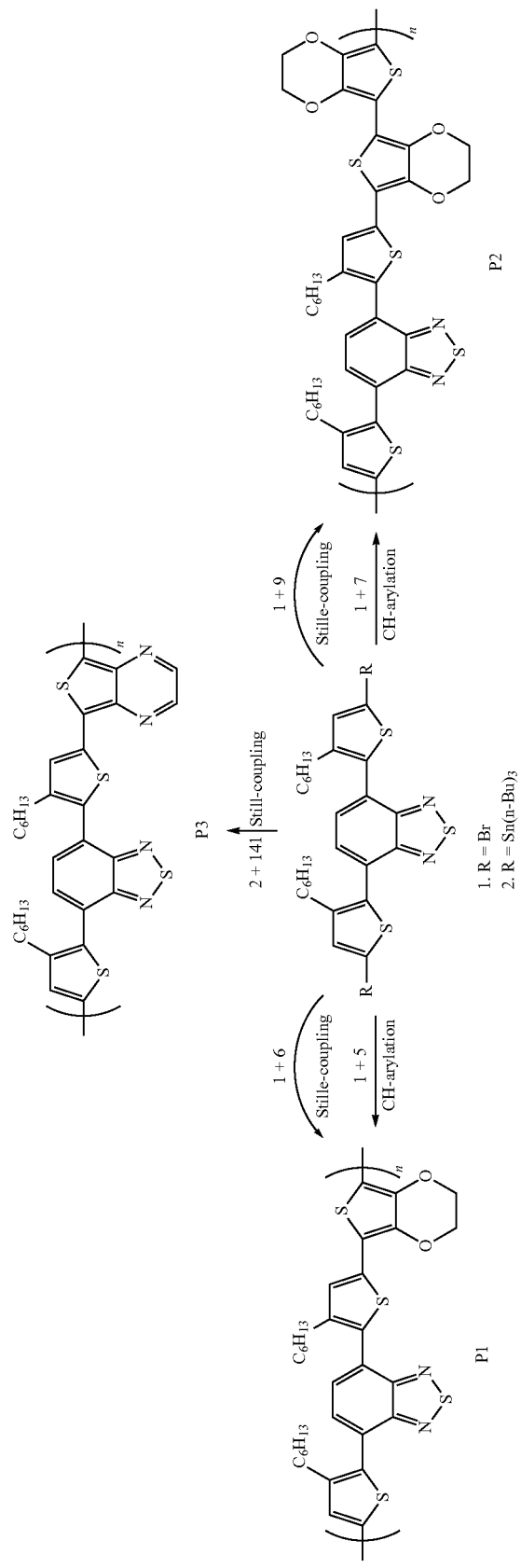

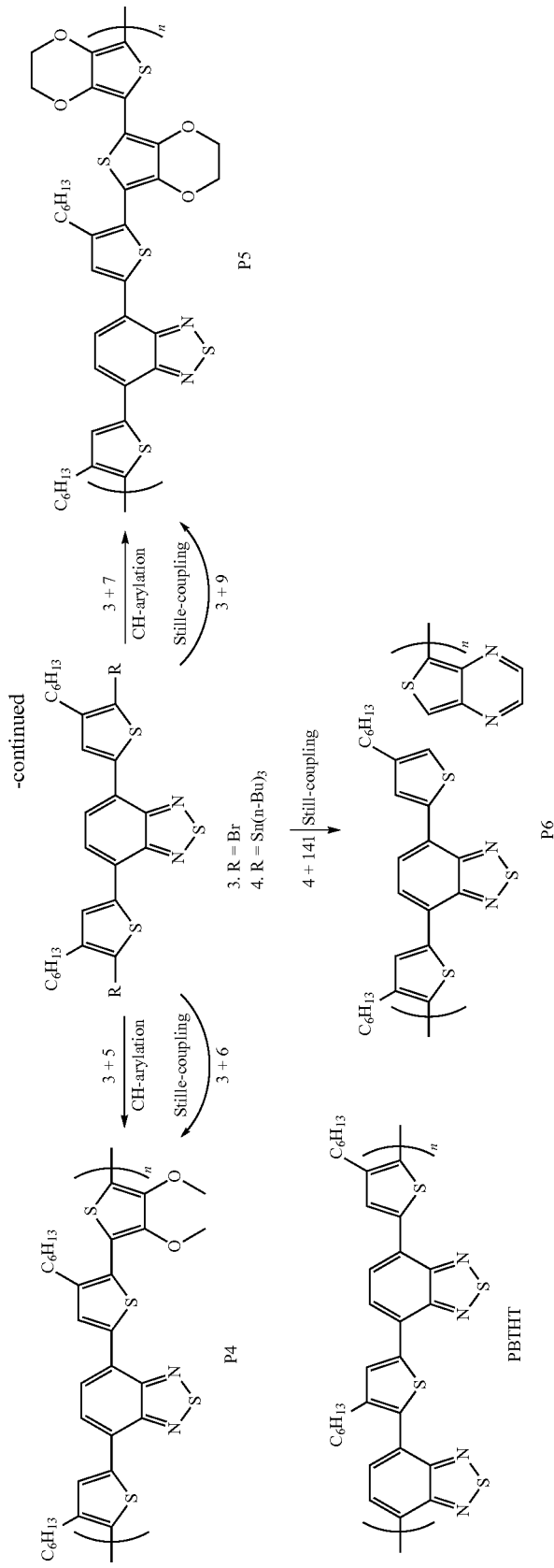

Polymerization Condition: (1) Stille Cross-Coupling: Pd(PPh$_3$)$_4$, DMF, Microwave Irradiation, and (2) CH-arylation Potassium acetate, tetrabutylammonium bromide, Pd(OAc)$_2$, Microwave Irradiation After experiments under several reaction conditions, corresponding P3 and P6 were finally obtained in high yields (92% and 910, respectively) by Stille cross-coupling of 5,7-dibromothieno[3,4-b]pyrazine (14) and 2 or 4 in DMF in presence of Pd(PPh$_3$)$_4$ at 130 for 15 minutes, wherein average molecular weight (Mn) and polydispersity index (PDI) values had reasonable ranges (see Table 1). However, in polymerization reaction performed at high temperature for a long time, polymers hardly-solubilized in the most general organic solvents were obtained. PBTHT having only BT and HT units without additional donors was prepared, wherein the used preparing method includes Stille cross-coupling of co-monomer 2 or 4 and 4,7-dibromo-2,1,3-benzothiadiazole in anhydrous DMF in presence of Pd(PPh$_3$)$_4$ under microwave reaction conditions. Chemical structure of the obtained copolymer was confirmed by $^1$H NMR and elemental analysis.

That is, after precipitating mixtures in methanol, crude copolymer was filtered and extensively washed with methanol, followed by Soxhlet extraction with methanol and acetone, thereby removing byproduct and oligomer. Analysis of the purified polymer showed that a palladium catalyst was completely removed. Under the used reaction conditions, the synthesized copolymers showed excellent room temperature solubility in the most general organic solvents such as chloroform, chlorobenzene and xylene (>5 mg mL-1). As shown in Table 1, copolymers (P4 to P6) obtained from copolymerization of co-monomer 3 or 4 generally had a Mn value lower than that of corresponding copolymers (P1 to P3, respectively) originated from co-monomer 1 or 2. The reason is that high steric hindrance between added units and HT-BT-HT units (3 and 4) in former copolymers (P4~P6) during a Stille coupling reaction, wherein it is considered that the steric hindrance is caused by hexyl side chains toward the outside at 4,4'-position in thiophene ring of 3 and 4.

(2) Direct CH-Arylation of EDOT

Meanwhile, properties of polymers (P1, P2, P4 and P5) obtained by new synthesis method (Reaction Formula 4) capable of constituting EDOT-based π-conjugated copolymer using easy arylation of EDOT were compared with those of the same copolymers obtained by Stille cross-coupling method. A polymerization reaction was performed in presence of KOAc, t-Bu$_4$NBr (TBAB) and catalytic amount of Pd(OAc)$_2$ in anhydrous DMF. Results thereof were shown in parentheses of the following Table 1.

TABLE 1

Polymerization Results and Thermal Property of PBTHT and P1-P6[a] Copolymer

| Polymer | M$_n$ (Kg/mol)[b] | PDI (M$_w$/M$_n$)[b] | Yield (%)[c] | T$_d$ (° C.)[e,f] | T$_g$ (° C.)[e,g] |
|---|---|---|---|---|---|
| PBTHT | 18.63 | 2.10 | 87 | 365.8 | 72.4 |
| P-1 | 27.91 (22.20)[d] | 1.50 (1.61)[d] | 97 (95)[d] | 383.16 | 109.45 |
| P-2 | 25.69 (16.39)[d] | 1.55 (1.55)[d] | 93 (82)[d] | 380.07 | 141.81 |
| P-3 | 28.72 | 1.62 | 92 | 351.44 | 151.77 |
| P4 | 25.74 (18.37)[d] | 1.40 (2.15)[d] | 88 (91)[d] | 390.53 | 118.82 |
| P-5 | 19.69 (15.79)[d] | 1.49 (2.77)[d] | 89 (90)[d] | 369.84 | 185.72 |
| P6 | 24.08 | 1.40 | 91 | 354.59 | 194.56 |

[a]All copolymerization were performed with DMF using Stille cross-coupling in presence of Pd(PPh3)4 and sometimes performed under microwave conditions, if needed.
[b]GPC Calculation(Eluent CHCl$_3$, polystyrene stan dar ds; see Supporting Information for their SEC curves)
[c]Yields were obtained by performing Soxhlet extraction and drying process in vacuum depending on mass of the polymers.
[d]insertion values were obtained by copolymerization using direct C—H acylation for copolymers.
[e]measurement on polymer samples obtained by polymerization with microwave
[f]measurement of temperature at which polymers were heated under nitrogen atmosphere at a rate of 10 per minute to initiate decomposition (decrease in mass by 5%) by TGA
[g]determination of DSC heated under nitrogen atmosphere at a rate of 10 per minute.

Pd-catalytic CH-arylation of EDOT 5 and co-monomer 1 was tested under heating and microwave reaction conditions. In heating condition, even though the reaction time was long, oligomer reactant only was obtained with the maximum average molecular weight by GPC analysis of 3933, and PDI value of 3.82. Meanwhile, in microwave reaction condition, a target copolymer P1 was obtained in 95% yield with excellent molecular weight (Mn=22220) and PDI of 1.61. In Pd-catalytic CH-arylation of co-monomer 1 and bis-EDOT7, a polymer P2 corresponding to 82% yield was exclusively obtained. In the case of copolymerization of the co-monomer 3, 5 or 7 performed under the same Heck reaction conditions, corresponding copolymers P4 and P5 were obtained in 91% and 90% yields, respectively. It was confirmed that $^1$H-NMR and UV-vis spectrum data of obtained copolymers (P1, P2, P4 or P5) were the same as those of the corresponding copolymers prepared by Stille cross-coupling method.

Selectivity measured from CH-arylation was explained by reaction mechanism (Reaction Formula 4) based on an inference similar to assumption from an arylation of 3-carboalkoxy furan, thiophene, and EDOT. In this mechanism, a solvent DMF is advantageous for ionization of Br—Pd—Ar—Pd—Br to Br—Pd+—Ar—Pd+Br— species A. The electrophilic species A is reacted at electron-abundant 2-position of EDOT to produce a cationic intermediate B. After a proton separation and reductive removal, the species B is converted into 2,2'-arylated reactant C. The following Reaction Formula 4 shows a mechanism route suggested for 2,2'-arylated selective origin of EDOT.

[Reaction Formula 4]

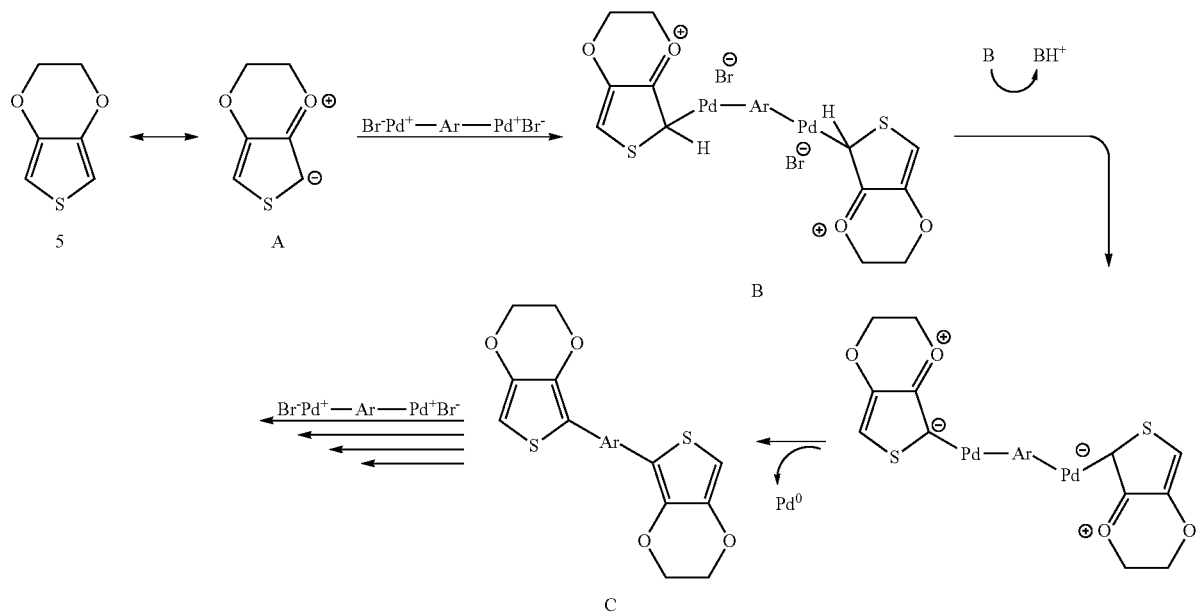

Experimental Example 1

Thermal Property

Thermal properties of copolymers P1~P6 and PBTHT were evaluated by TGA and DSC under nitrogen atmosphere. TGA shows that when a temperature increases up to 800, residual weights of all copolymers are more than 50% (FIG. 1). Copolymers showed one-step decomposition. Pyrolysis temperature (Td, 95 wt % remainder) has a range of 351 to 401 (Table 1), which is caused by side chain decomposition at the time of heating and shows high thermal stability of the synthesized copolymer. FIG. 1 shows a TGA thermogram of P1 to P6.

Figure 2:
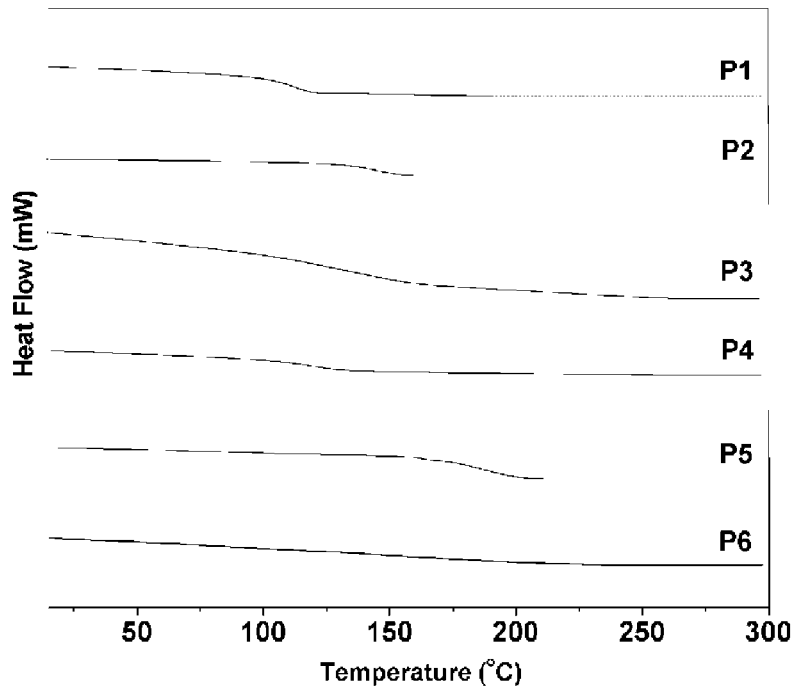
FIG. 2 shows DSC curves of P1 to P6.

Glass transition temperature (Tg) of the synthesized copolymers measured by DSC were summarized in the following Table 1 and DSC curves of P1 to P6 were shown in FIG. 2. Polymer samples were heated up to 300, and DSC data reported in second heating cycle was obtained. DSC analysis showed that PBTHT (which is not combined with additional donors) only having BT and HT in repeated units is an amorphous material having Tg of 72.4 (Table 1). Other copolymers had a Tg value higher than that of PBTHT in a range of 109 to 195. At the time of combining the polymer with donor and/or acceptor Tg value is increased in a sequence of EDOT (P1: 109; and P4: 119), bis-EDOT (P2: 141; and P5: 186), and TP (P3: 152; and P6: 195), which indicates that a highly arranged structure has strong intermolecular interaction in a lattice copolymer. In the case in which bis-EDOT units are inserted into a backbone of a copolymer, self-solidity is induced in a conjugated system due to non-covalent S . . . O intermolecular interaction, such that planarity of the copolymer combined with bis-EDOT is increased and Tg thereof is higher than that of EDOT. FIG. 2 shows DSC curves of P1 to P6.

Figure 3:
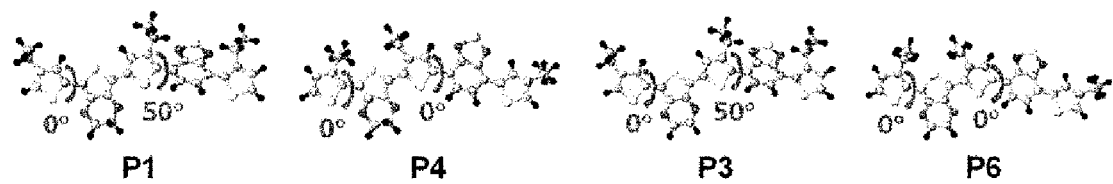
FIG. 3 shows a quantum-mechanically optimized [B3LYP/6-311G(d,p)] geometric structure of model fragments of an alternating copolymer bound to additional donors such as (a) EDOT or (b) TP in addition to HT-BT-HT units.

In addition, it is noted that copolymers (P4 and P6, respectively) obtained from copolymerization of co-monomer 3 or 4 generally have a Tg value higher than that of copolymers (P1 and P3, respectively) originated from co-monomer 1 or 2. The reason is that former copolymers (P4 and P6) had favorable intermolecular interaction between more planate polymer chains as shown in model fragment structures of P1, P3, P4, and P6, optimized in quantum mechanics according to density functional theory (DFT) at a level of B3LYP/6-311G(d,p) (FIG. 3). Even in PBTHT repeated units group as well as copolymers such as P1 and P3, hexyl side chains toward the inside from 3,3'-position of thiophene rings of 1 and 2 are positioned right next to 6-membered phenyl ring of BT, wherein steric hindrance between the hexyl side chains and rings disappears by distortion of dihedral angle up to about 50°. Therefore, an effective p-conjugate length is decreased. Meanwhile, in the case of copolymers such as P4 and P6 combined with 3 and 4, H atoms toward the inside at 3,3'-position of thiophene form similar-hydrogen bond with N atoms of BT, which is favorable to a plane-disposition, and the hexyl side chain toward the outside at 4,4'-position is positioned at a side of a 5-membered thieno ring of a donor group without significant steric hindrance even in the plane-disposition. Based on the above-described results, due to highly thermal stability and highly arranged form, the synthesized polymer, in particular, P6 may be a good candidate as an active layer material of various organic apparatuses.

FIG. 3 shows a quantum-mechanically optimized [B3LYP/6-311G(d,p)] geometric structure of model fragments of an alternating copolymer bound to additional donors such as (a) EDOT or (b) TP in addition to HT-BT-HT units. (a) P1 and P4, (b) P3, P6. The most representative torsion angle is shown as a red color, which indicates that planarity of polymer backbone of P4 and P6 is higher than that of P1 and P3. Color Code: Gray (C), Black (H), Blue (N), Red (O), and Yellow (S)

Experimental Example 2

Optical Property (1) Effect on Position of Hexyl Group in HT Unit

Figure 4A:
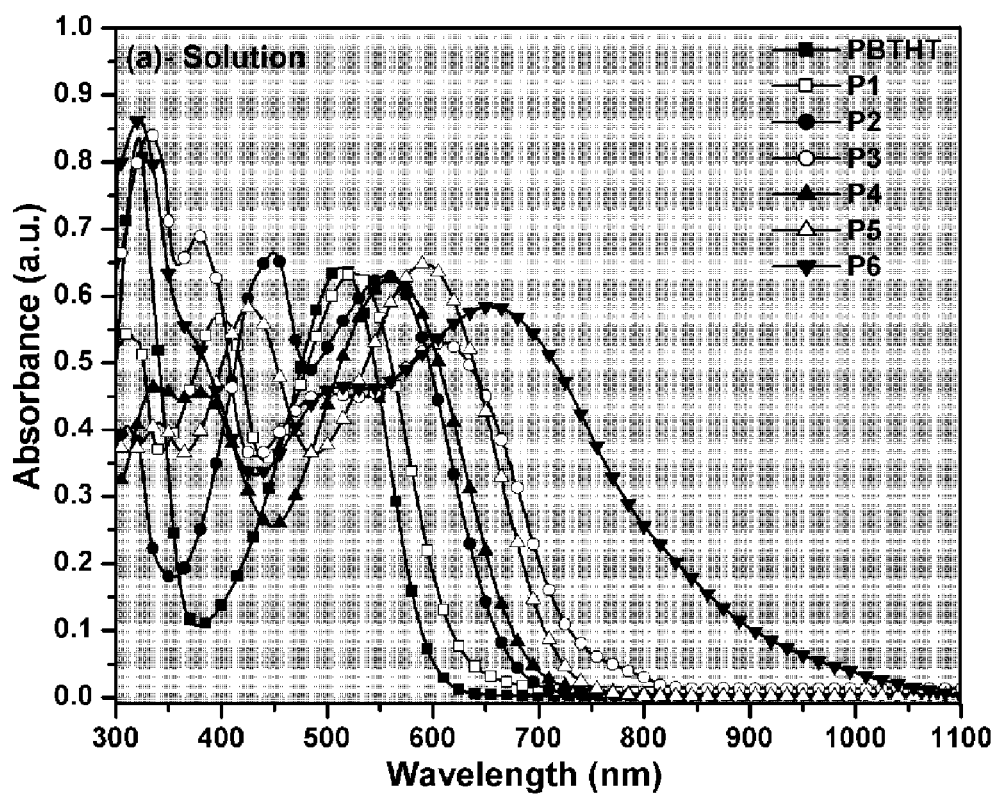
FIGS. 4A and 4B show UV-vis spectrums of PBTHT and P1~P6 copolymers, respectively.
Figure 4B:
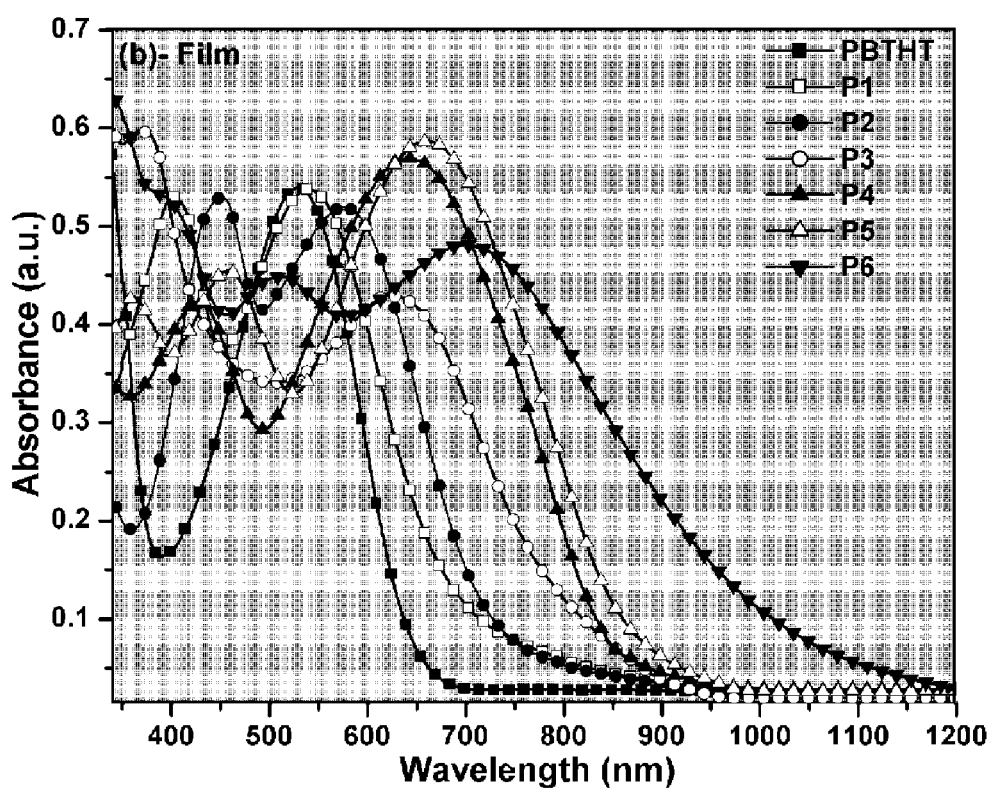

FIGS. 4a and 4b show standard UV-vis absorption spectrums of copolymers P1 to P6 and PBTHT, wherein each spectrum was obtained from solid-state films manufactured using chlorobenzene solution on a glass slide through a spin-coating process. Maximum absorption ($\lambda_{max}$), onset wavelength ($\lambda_{onset}$) and optical band gap ($E_g^{op}$) presumed from $\lambda_{onset}$ onset are summarized in Table 2.

The thin film spectrums in all polymers were moved toward red color and extensively shown as compared to corresponding absorption spectrum in the solution, which reflects that an interchain interaction and regularity are increased in the solid state and p-conjugation is extended. Therefore, optical band gaps of all polymers determined from $\lambda_{onset}$ [$E_g^{op}$ (eV)=1240/$\lambda_{onset}$ (nm)] of thin film are lower than those of the solution. As expected from high Tg values of the above-discussed former copolymers, red-shifted amounts of $\lambda_{onset}$ in polymer [P4 (156 nm), P5 (157 nm) and P6 (152 nm)] combined with 3 and 4 and supposed to be more planate are significantly larger than those in polymers [P1 (70 nm), P2 (59 nm) and P3 (86 nm)] originated from 1 and 2 and more distorted. With the same reason, low-Tg polymer PBTHT showed a weak red-shift (51 nm) from solution $\lambda_{onset}$ toward thin film $\lambda_{onset}$.

FIGS. 4A and 4B show UV-vis spectrums of PBTHT and P1~P6 copolymers, respectively, and Table 2 shows optical and electric properties of PBTHT and P1~P6 copolymers, respectively.

TABLE 2

Optical and Electric Properties[a] of PBTHT and P1~P6 Copolymers

| | UV-vis absorbtion | | | | | | Cyclic Voltammetry[c] | | |
|---|---|---|---|---|---|---|---|---|---|
| | Solution | | | Film | | | | | |
| Ploymer | $\lambda_{max}$ (nm) | $\lambda_{onset}$ (nm) | $E_g^{op}$ (eV)[b] | $\lambda_{max}$ (nm) | $\lambda_{onset}$ (nm) | $E_g^{op}$ (eV)[b] | $E_{HOMO}$ (eV) | $E_{LUMO}$ (eV) | $E_g^{cc}$ (eV) |
| PBTHT | 513 | 593 | 2.09 | 532 | 644 | 1.92 | −5.66 | −3.37 | 2.29 |
| P-1 | 526 | 624 | 1.99 | 541 | 694 | 1.78 | −5.09 | −3.31 | 1.78 |
| P-2 | 556 | 667 | 1.86 | 576 | 726 | 1.71 | −5.06 | −3.35 | 1.71 |
| P-3 | 610 | 734 | 1.69 | 630 | 820 | 1.51 | −5.11 | −3.46 | 1.65 |
| P-4 | 563 | 685 | 1.81 | 642 | 841 | 1.47 | −4.93 | −3.41 | 1.52 |
| P-5 | 593 | 710 | 1.75 | 661 | 867 | 1.43 | −4.82 | −3.34 | 1.48 |
| P-6 | 658 | 851 | 1.46 | 704 | 1003 | 124 | −5.06 | −3.56 | 1.50 |

[a]All data was prepared under microwave polymerization reaction conditions.
[b]represents calculation from an intersection of optical band gap ($E_g$) reference point and low energy edges of absorption spectrum
[c]Onset possibility was obtained from intersection under two points of contact at an increase current and a changing-criterion current of CV curve.

In fact, in the solution or the thin film, observed absorption onset wavelength at the former polymers [thin film: P4 (841 nm), P5 (867 nm) or P6 (1003 nm)] is higher than that of the latter polymers [thin film: PBTHT (644 nm) and P1 (694 nm), P2 (726 nm) or P3 (820 nm)] as well as the solution-thin film red-shifted amount. In other words, it seems that movement of hexyl chains from 3,3'-position (inner type) to 4,4'-position (outer type) of thiophene ring increases planarity of the polymer backbone, effective p-conjugation length is increased, and the red-shift of the absorption spectrum and the decrease in the optical band gap are induced.

(2) Effect of Donor and Acceptor

In addition, copolymers P1 to P6 are characterized by two (or more) main absorption peaks shown in 300 to 1200 nm ranges, which are generally observed in donor-acceptor alternating copolymer. As seen from molecular orbital and electron transition diagram of model fragments of P1 and P4 (FIG. 5(a)) obtained from DFT of B3LYP/6-311G(d,p) level and time-dependent DFT (TDDFT) quantum mechanics calculation in optimized geometric structure shown in FIG. 3, long wavelength absorption peak ($\lambda_{max} \geq 520$ nm) is caused by the lowest energy singlet-singlet transition (shown by a solid line arrow) corresponding to electric charge transfer in molecules from highest occupied molecular orbital (HOMO) localized at donor unit (HT-X-HT; X is additional donor such as EDOT) to lowest unoccupied molecular orbital (LUMO) localized at an acceptor unit (BT). Short-wavelength absorption peak (solution: $\lambda_{max} \leq 500$ nm) is caused by next lowest-energy transfer (shown by a dotted line arrow) mostly localized at donor unit (HT-X-HT; from HOMO to LUMO+1) or an acceptor unit (BT; from HOMO-1 to LUMO). As seen at the bottom panel of FIG. 5, theoretical electron transition wavelengths (thick solid line bar) are identical to positions of the maximum absorption peaks ($\lambda_{max}$) shown in UV-vis spectrum (thin solid curve) experiment.

Figure 5A:
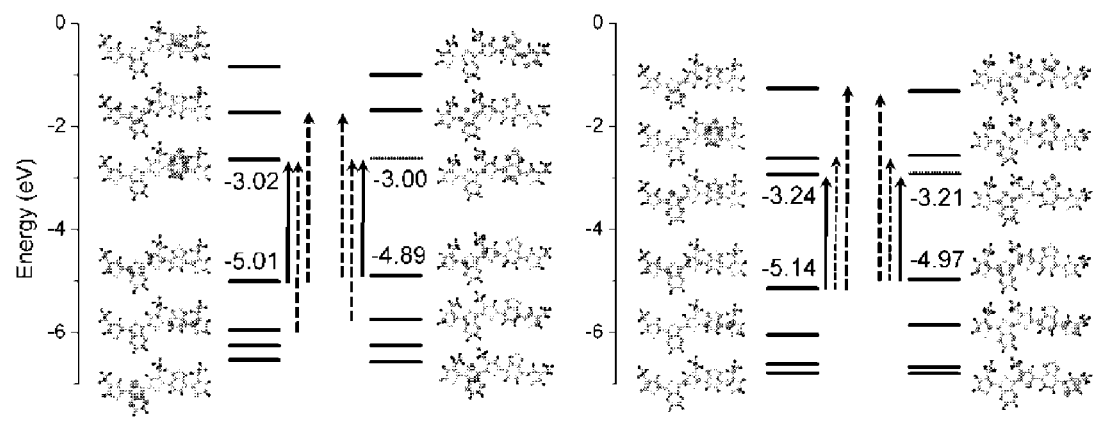
FIG. 5A shows molecular orbital (MO) diagrams of model fragments shown in FIG. 3 representing alternating copolymers ((a) [-EDOT-HT-BT-HT-]n and (b) [-TP-HT-BT-HT-]n) of additional donors such as EDOT (left-side) and PT (right-side) in addition to HT-BT-HT.

FIG. 5A shows molecular orbital (MO) diagrams of model fragments shown in FIG. 3 representing alternating copolymers ((a) [-EDOT-HT-BT-HT-]n and (b) [-TP-HT-BT-HT-]n) of additional donors such as EDOT (left-side) and PT (right-side) in addition to HT-BT-HT. Energy levels of occupied MO and unoccupied MO are represented by black and red horizontal lines, respectively. Positive and negative phase of each orbital are represented by green and pink lobes. The lowest energy and the next lowest energy electron transition are represented by solid line and dotted line arrows. Thickness of arrows roughly outline oscillator strength of each transition.

The oscillator strength is obtained from DFT and TDDFT calculation at B3LYP/6-311G(d,p) level.

Absorption spectrums of FIGS. 5b to 5e consist of TDDFT singlet-singlet electron transition (thick solid line bar), wherein position and height of peaks are obtained by theoretical transition energy and oscillator strength. Theoretical transition wavelength is identical to the maximum peak position shown in UV-vis absorption spectrum (thin solid line curve) experiment.

Figure 5B:
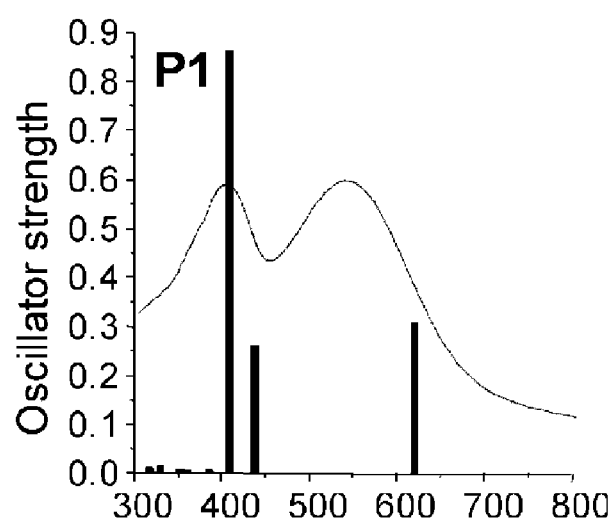
FIGS. 5b to 5e show an absorption spectrum.
Figure 5C:
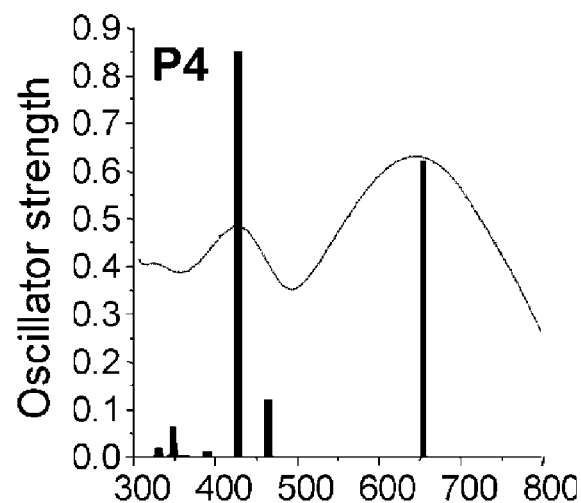
Figure 5D:
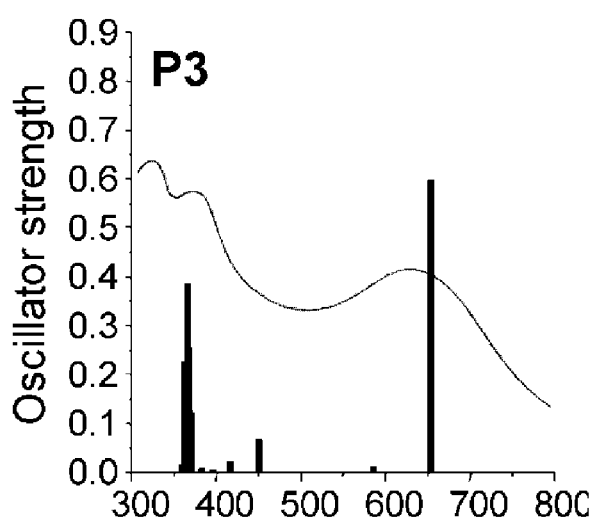
Figure 5E:
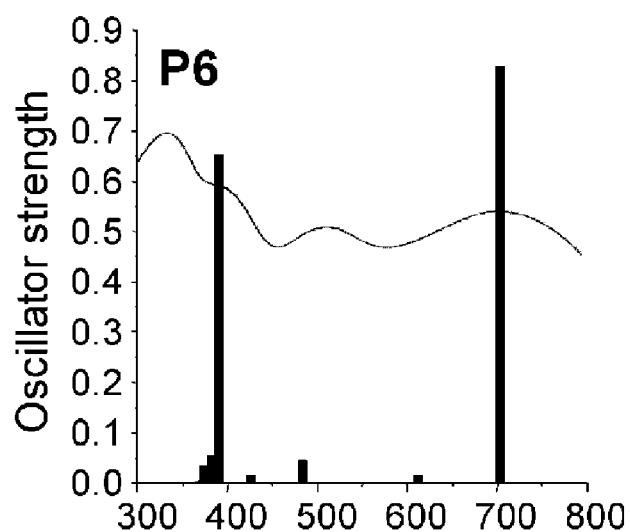

Band gap may be decreased by fine-controlling energy level of HOMO and LUMO of donor and acceptor. According to DFT and TDDFT calculation by a small monomer unit (FIG. 6), TP unit shows significantly low LUMO level, which is similar (−2.48 vs −2.34 eV) to the level of BT unlike EDOT (−0.29 eV). Therefore, in the case in which TP and HT-BT-HT are coupled with each other, closely positioned (on energy) LUMO levels are mixed to obtain P3 and P6, and in particular P6 which is more planate shows π-conjugation extended at LUMO level and beneath LUMO and LUMO+1 level (FIG. 5b). Absorption of P3 and P6 is extended u6pto longer wavelength, and in particular, polymer P6 shows a strong absorption band at the longest wavelength region as compared to the other polymers ($\lambda_{max}$=658, solution, 704 nm, thin film), which is extended over 1000 nm ($\lambda_{onset}$=1003, thin film). It may be confirmed by an electrochemical analysis that P6 among all polymers had the lowest LUMO level.

Figure 6:
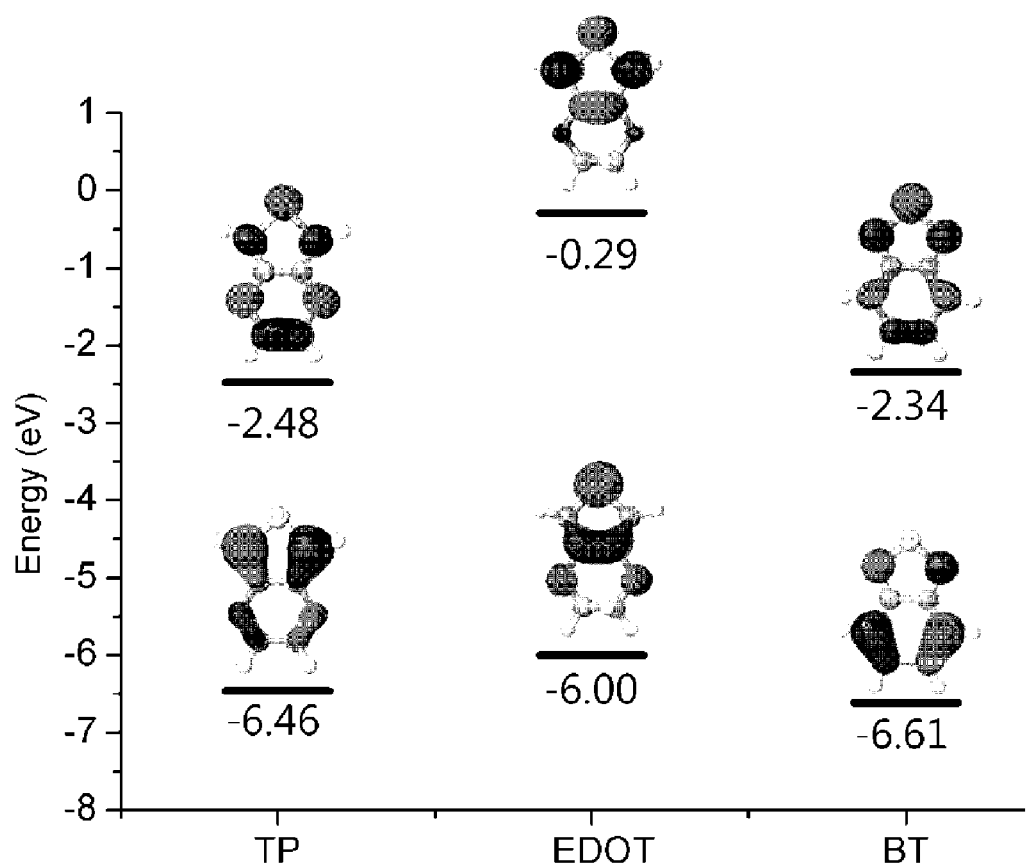
FIG. 6 shows HOMO and LUMO energy levels of donor and acceptor units (TP, EDOT and BT)

FIG. 6 shows HOMO and LUMO energy levels of donor and acceptor units (TP, EDOT and BT). Energy levels of occupied MO and unoccupied MO are represented by black and red horizontal lines, respectively. Positive and negative phase of each orbital are represented by green and pink lobes.

Experimental Example 3

Electrochemical Property

Figure 7:
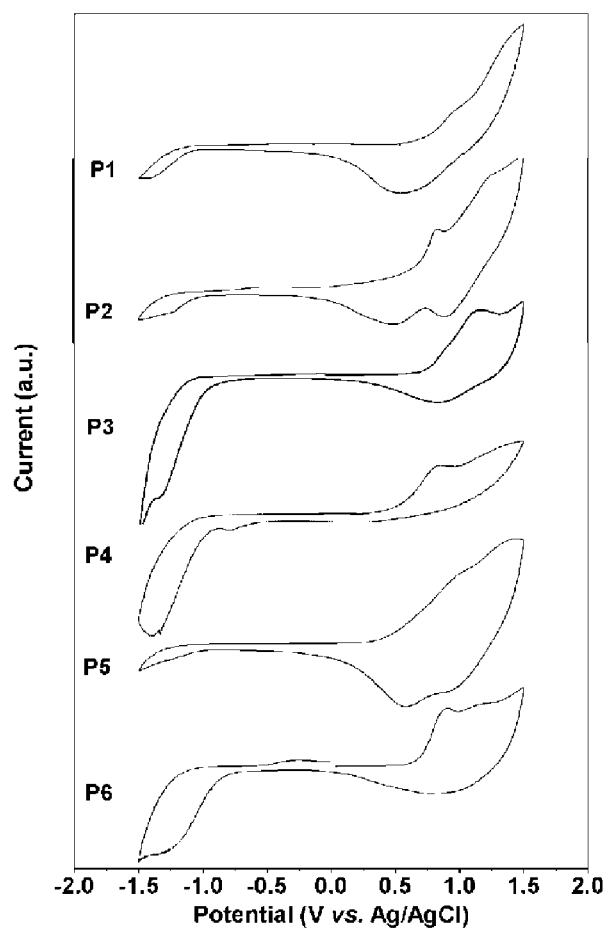
FIG. 7 shows cyclic voltammetry graphs of P1 to P6.

Electrochemical property of copolymers P1 to P6 and PBTHT were examined by cyclic voltammetry (CV). Cyclic voltammetry of P1 to P6 were shown in FIG. 7. HOMO and LUMO energy level ($E_{HOMO}$ and $E_{LUMO}$) of polymers are determined by the following relationship (23): $E_{HOMO}$=−$E_{ox}$−4.4 and $E_{LUMO}$=−$E_{red}$−4.4 (eV unit), wherein $E_{ox}$ and $E_{red}$ are onset oxidation and reduction potential of the polymer with respect to Ag/AgCl reference electrode. Induced $E_{HOMO}$, $E_{LUMO}$ and electrochemical band gaps ($E_g^{ec}$=$E_{LUMO}$−$E_{HOMO}$) are summarized in Table 2. The presumed $E_g^{ec}$ value is slightly higher than presumed optical band ga6p($E_g^{op}$) in thin film, which is probably due to an interfacial barrier present between the polymer membrane and the electrode surface (22c, 24). Positions of hexyl side chains on HT are changed and additional donor and acceptors are coupled with the polymer backbone, such that remarkable effect on an electrochemical behavior may be exerted. FIG. 7 shows cyclic voltammetry graphs of P1 to P6.

As observed from optical measurement, presumed $E_g^{ec}$ values (1.48~1.88 eV) of copolymers P1 to P6 were lower than those of PBTHT (2.29 eV), confirming importance in combining the HT-BT-HT-based polymer with appropriate additional donor or acceptor units in achieving the low band gap. As discussed above, a large $E_g^{ec}$ of PBTHT is due to slightly localized (on HT) HOMO energy level (−5.7 eV), wherein the energy level is disposed at a lower position than the extended (above HT-X-HT unit) HOMO of polymers P1 to P6 (−4.8 to −5.3 eV). LUMO energy level (−3.4 eV) is essentially maintained at the same level with the other polymers (−3.3 to −3.6 eV). LUMO is mostly localized at the common donor (BT) unit in all copolymer, and thus, most of the polymers show similar LUMO level and similar reduction potential. The lowest LUMO (−3.6 eV) is found in P6 combined with TP which is an acceptor provided with slightly insufficient electrons. As discussed above, it causes LUMO level having low combination which is favorable to LUMO levels identical to TP and BT both present in the plane polymer backbone.

Meanwhile, polymers P1, P2, P4 and P5 combined with 1 or 2 electron-abundant EDOT unit show HOMO level (−5.1, −5.1, −4.9, and −4.8 eV). It is noted that an increase in the number of EDOT in repeated units (P1 to P2 or P4 to P5) is hardly affected to HOMO level.

Remarkable effect on the HOMO level is rather induced by position-modification of hexyl side chain of HT (P1 to P2 or P4 to P5). More generally, HOMO level in polymer [P4 (−4.9), P5 (−4.8) and P6 (−5.1); eV] combined with 3 and 4 and supposed to be more planate is significantly higher than that in polymers [P1 (−5.1), P2 (−5.1), and P3 (−5.1); eV] originated from 1 and 2 and more distorted, and thus, the former polymers having extended π-conjugation show $E_g^{ec}$ value (1.48~1.62 eV) lower than those of the latter polymers (1.65~1.88 eV).

The presumed HOMO level (−4.8 to −5.3 eV; P6: −5.1 eV) on the copolymers P1 to P6 is significantly higher than air oxidation threshold (about −5.27 eV), which shows excellent stability on air and oxygen of the polymer, the stability being requirements in an apparatus use. Meanwhile, voltage open circuit (Voc) of organic photovoltaic cell is directly related with a difference between HOMO level of electron donor (polymer) and LUMO level of electron acceptor (PCBM). The low HOMO level of the donor polymer may induce high Voc in an obtained polymer solar cell (5c). The presumed LUMO level (−3.3 to −3.6 eV; P6: −3.6 eV) of P1 to P6 are higher than that of PCBM (−4.3 eV)(5c), which permits a light-induced electron transfer favorable to PCBM. Therefore, the copolymer, in particular, P6 becomes a promising candidate of a donor polymer used in an active layer of PCBM-based BHJ organic photovoltaic cell apparatus.

Experimental Example 4

Photovoltaic Cell Property

Figure 8:
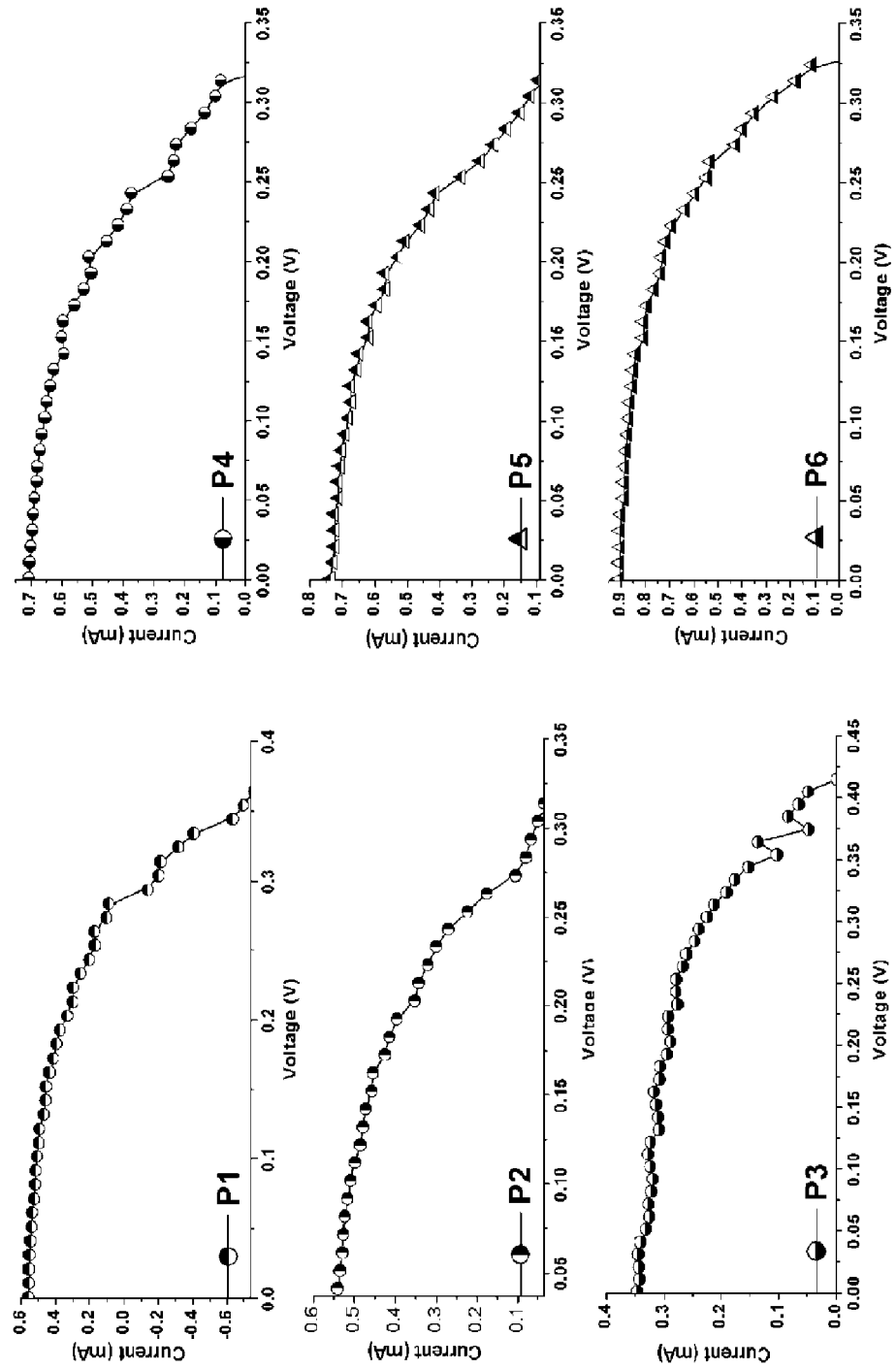
FIG. 8 shows current-voltage properties of BHJ solar cells of copolymers (P1~P6) (irradiation strength of 100 mW/cm$^2$, PCBM), respectively.

In order to examine properties of the photovoltaic cell of the copolymers (P1~P6), a BHJ photovoltaic cell having a structure of ITO/PEDOT: PSS/copolymer [60]PCBM/Al was manufactured, wherein the copolymers were used as donor and PCBM was used as an acceptor. It is known that solvents used in manufacturing active layers have strong influence on the performance of a cell. Therefore, chlorobenzene is selected to obtain a film having excellent quality. Current-voltage properties in the apparatuses were simultaneously recorded at a Solar Simulator AM 1.5G (100 mW/cm$^2$). Current-voltage (I-V) curves measured under simulated sunray (100 mW/cm$^2$) are shown in FIG. 8. The related parameter is summarized in Table 3. FIG. 8 shows current-voltage properties of BHJ solar cells of copolymers (P1~P6) (irradiation strength of 100 mW/cm$^2$, PCBM), respectively.

Figure 9:
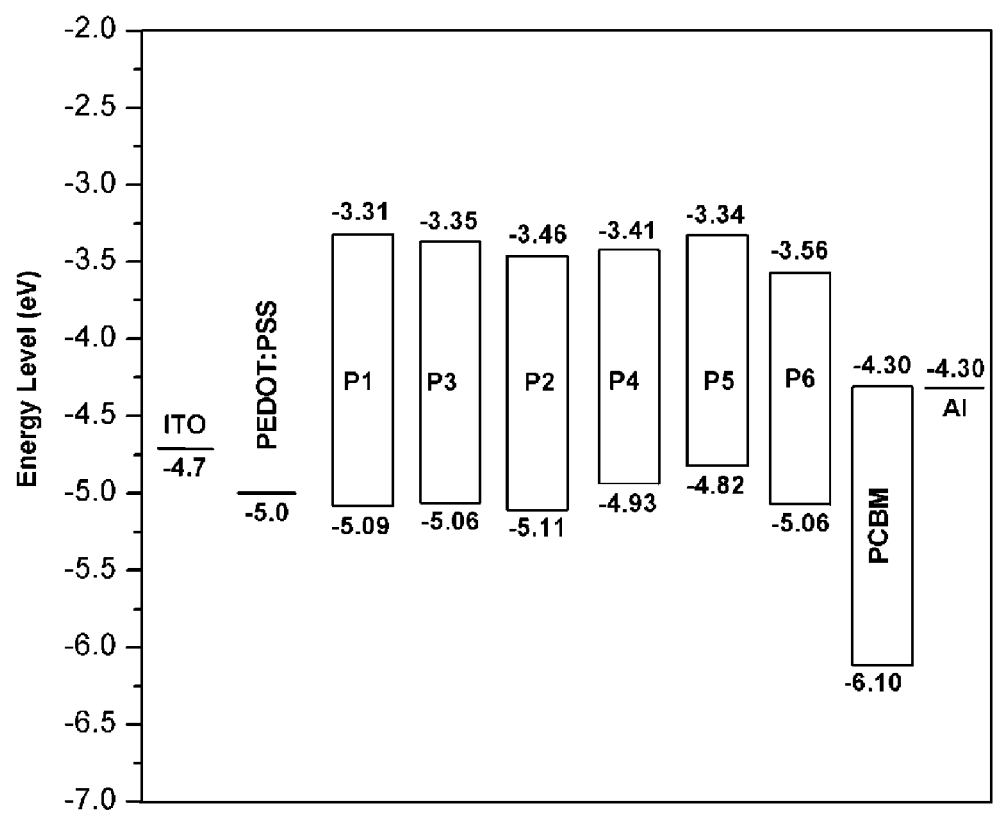
FIG. 9 shows a diagram of energy band structures of copolymers (P1~P6).

Typically, voltage open circuit (Voc) is controlled by an energy relationship between donor and acceptor. In particular, the highest occupied molecular orbital (HOMO) of donor and the lowest unoccupied molecular orbital (LUMO) of acceptor is closely related with Voc value. The HOMO and LUMO levels of the copolymers P1 to P6 calculated from the onset of the oxidation and reduction peak potential are shown in Table 2. As shown in FIG. 9, the LUMO level of the copolymer (changed from −3.31 eV to −3.56 eV) assures descent propulsion for electron separation toward [60] PCBM or [70] PCBM. In addition, Voc was affected by the property of a hetero junction having a significant influence on a film-manufacturing condition.

In the present invention, HOMO of PCBM more increased than the LUMO thereof decreases the Voc value. The apparatuses show relatively low Voc, wherein there is no more than 0.41 eV in any one of the apparatuses. High Voc is identical to the low HOMO energy level of P1 (−5.09 eV) and P3 (−5.11 eV). High short-circuit current (Isc) value was observed in the synthesized polymer despite the low Voc, which is due to an excellent photon absorption property in the long wavelength range, and the absorption property is particularly advantageous for P6 ($E_g^{op}$; 1.24 eV) in view of short-circuit current density (Jsc) and low band gap. In P6, low Voc (0.326V) was shown; however, was absorbed significantly much lighter ($\lambda_{onset}$=1003 nm) as compared to the other copolymer, which will induce appropriate filing rate (FF) near to Isc (0.908 mA) and 51.88% which are consequently superior values, thereby achieving the best performance (PCE; 3.32%).

As compared to the thin film apparatus, P1 using active layer having a thickness of 140.9 nm shows the lowest FF (36.03%). This is due to hole mobility of P1, the hole mobility increases Rs and decreases Rsh in a thick film (Rs is a series resistance and Rsh is shunt resistance). In the case in which hexyl chains are moved into an inner core of BT, steric hindrance between aromatic units and hexyl chains on a conjugate backbone is induced, which increases band gap of P1 to P3 and decreases hole mobility as compared to an external core of P4 to P6.

After considering all results, current density of six polymers are influenced on optical properties and nature of the molecular structure. The performance is achieved in a simply manufactured apparatus without additives or additional layers, which is advantageous for manufacturing a polymer solar cell at low cost. FIG. 9 shows a diagram of energy band structures of copolymers (P1~P6) and Table 3 show PV performance of the copolymers.

TABLE 3

PV Performance of Copolymer (P1-P6)

| Polymer | polymer:PCBM | thickness (nm) | Voc (V) | Jsc (mA) | Jsc (mA/cm$^2$)[a] | FF (%) | η (%) |
|---|---|---|---|---|---|---|---|
| P1 | 1:1 | 140.90 | 0.360 | 0.556 | 11.97 | 36.03 | 1.55 |
| P2 | 1:1 | 127.50 | 0.308 | 0.546 | 11.77 | 42.95 | 1.56 |
| P3 | 1:1 |  | 0.416 | 0.341 | 7.35 | 51.14 | 1.53 |
| P4 | 1:1 | 94.60 | 0.319 | 0.705 | 15.19 | 49.56 | 2.40 |
| P5 | 1:1 | 88.96 | 0.313 | 0.730 | 15.74 | 47.49 | 2.34 |
| P6 | 1:1 |  | 0.326 | 0.908 | 19.57 | 51.88 | 3.32 |

[a]Active Region of Apparatus (0.0464 cm$^2$)

A surface shape of an active layer is significantly important for performance of photovoltaic cell in a bulk hetero junction solar cell. In order to observe the surface shape, a surface of a membrane obtained from a copolymer mixture [60]PCBM=1:1 in chlorobenzene solution using a tapping mode atomic force microscope (AFM) was examined. Surface phases photographed on each membrane were shown in FIGS. 10a to 10f. Surface roughness values measured by phase microscopy were about 0.21, 0.83, 0.90, 0.29, 0.31 and 0.28 nm with respect to P1 to P6, respectively. Different shapes of the copolymer membranes were observed, which suggests that an interaction between molecules in each polymer may be different. A uniform particle-agglomeration was observed in P3 matrix having a root-mean-square (rms) of 0.90 nm (FIG. 10c), which may induce a phase-separation, decrease possibility to diffuse and escape mobile electron carrier, and thus, increase recombination. The result is identical to a relatively low short-circuit current (7.35 mA/cm$^2$) obtained from P3:PCBM cell as compared to the other copolymers. A P6/PCBM mixed film is shown as a flat surface having rms of 0.28 nm (FIG. 10f), wherein a clear phase-separation is not observed. Since P6/PCBM molecules have excellent compatibility, an interfacial area is increased and apparatus-based Jsc is increased up to 19.57 mA/ed. In the other copolymers, a smooth surface shows excellent compatibility of the copolymers and [60]PCBM, wherein the phase-separation is not shown and thus, Jsc and FF are increased.

In addition, electric charge transfer between the copolymers (P1, P2, P4 and P5) and [60]PCBM was researched by FTIR spectrometry. As shown in FIG. 11, new and wide bands at 914 cm-1 and 1017 cm-1 indicates that electric charge transfer to PCBM molecules in the copolymer is generated to form positive polaron in polymer chains (a quinoid structure).

As described above, a series of donor-acceptor copolymers were synthesized by combining 4,7-bis(3,3'/4,4'-hexylthiophene-2-yl)benzo[c][2,1,3]thiadiazole (HT-BT-HT) unit and additional donor and acceptor units such as EDOT, bis-EDOT and TP through a generally used Pd-mediated Stille cross-coupling method. A new method including performing a direct CH-arylation reaction on EDOT derivative using Pd(OAc)$_2$ which is a conventional catalyst in Heck-type experimental condition was suggested for synthesis of various EDOT-based copolymers, and it was confirmed that position of hexyl side chain on the HT unit had important influence on optico-physical and electrochemical properties of the polymer. The hexyl side chain is allowed so as not to be positioned right next to BT, such that steric hindrance may be decreased and a backbone structure may be further planarized, whereby π-conjugate and an interchain interaction may be increased. A significant red shift of UV-vis absorption spectrum, a decrease in optical and electrochemical band gap, and increase in a glass transition temperature were observed by relocating hexyl side chain in HT. In addition, it was confirmed that appropriate combination of donor and acceptor units is decisively important for achieving desired properties of the copolymer. Thienopyrazine (TP) unit among additional donors combined with HT-BT-HT extended absorption of the obtained thin film copolymer (-TP-HT-BT-HT-; P6) over 1000 nm, and decreased optical and electrochemical band gaps to 1.24 and 1.50 eV, respectively. The above-described result was explained by quantum mechanics calculation with respect to the model copolymer. LUMO level (P6; −3.56 eV) is higher than PCBM (−4.3 eV), which enables to a light-induced electron transfer from the donor polymer to the PCBM acceptor. In view of thermal, optical, and electrochemical properties, the copolymers according to the present invention, in particular, P6, may be a promising candidate for an active material used in organic photovoltaic cells and optoelectronic devices.

Quantum Mechanics Calculation

In order to achieve quantum mechanics calculation on four representative copolymers of P1, P3, P4 and P6, geometric structures of component units (EDOT, BT, TP, and T) from x-ray crystalline structures (36-38) were obtained, the obtained structures were connected with each other, ethyl side chains were attached at 3- or 4-position of T unit, thereby preparing several simple models representing P1, P3, P4 and P6. Then, the geometric structures at a ground state thereof were optimized at B3LYP/6-311G(d,p) level by density functional theory (DFT) (39-43). It was confirmed that the optimized geometric structures by normal mode analysis with respect to final geometric structures, respectively, are all minimum energy structures. Jaguar v6.5 Quantum Chemistry Software (44,45) were used in all calculations. Vertical singlet-singlet electron transition energy in each final geometric structure was calculated at the same [B3LYP/6-311G(d,p)] level using a time-dependent DFT (TDDFT) method (46-49). Gaussian 03 program (50) was used in this calculation. Since solvation in organic solvents used in this calculation has a slight influence on theoretical electron structure and spectrum, all calculations were achieved in a gaseous state.

Material

Unless otherwise stated, all procedures and reactions including reagents sensitive to air were performed under dry nitrogen atmosphere without oxygen. Commercially available products were purchased as all reagents and solvents, and dried according to standard procedures right before being used. Completion in all reactions was confirmed by TLC.

Apparatus and Method $^1$H and $^{13}$C NMR spectrum was measured in Varian spectroscopy (400 MHz, $^1$H; 100 MHz, 13C) at 25 in CDCl$_3$ using TMS, wherein chemical transfer was recorded in ppm units. Unit of a coupling constant (J) is Hz. Flash column chromatography was performed using Merck silica gel 60(Molecular size of 230~400 mesh ASTM). Silica gel obtained by adding silica gel with the same eluent used in the column chromatography to be neutralized was manufactured. Thin layer chromatography (TLC) for analysis was performed using an aluminum plate pre-coated with Merck 0.25 mm 60F silica gel and UV-254 fluorescent indicator. UV-vis absorption spectrum was obtained from pure polymer samples by Cary UV-Vis-NIR-5000 spectroscopy. A pyrolysis temperature was measured by a thermogravimetry (TGA-TA apparatus Q-50) under nitrogen atmosphere. DSC was performed by TA instrument (DSC-TA instrument Q-20) under nitrogen atmosphere at a heating rate of 10 per minute. CV measurement was performed in B-type solar simulator. Potentiostat/galvanostat (SP-150 OMA Company) supported electrolyte was tetrabutylammonium hexafluorophosphate (0.1M) dissolved into acetonitrile, a scanning rate was 50 mV/s, a cell having three electrodes was used, and a platinum wire and silver/silver chloride (Ag in 0.1M KCl) were used as a counter electrode and a reference electrode, respectively. A polymer membrane as the electrochemical measuring subject is spin-coated on an ITO glass slide using a polymer-chlorobenzene solution (about 10 mg/mL). GPC analysis was performed by Shimadzu (LC-20A Prominence series) instrument, chloroform was used as a carrier solvent (flow rate 1 mL/minute, 30), and a calibration curve was made using standard polystyrene samples. A microwave-assisted polymerization was performed by Discover S-Class System from CEM Microwave Technology. A low temperature reaction was necessarily performed in a low temperature chamber (PSL1810-SHANGHA EYELA). KD Scientific (KDS-100) which is a syringe pump was used to deliver reagent in an accurate and precise amount during an addition process.

Manufacture and Characterization of Apparatus

In the case of manufacturing an apparatus, ITO coating glass was washed in a ultrasonic washer for 15 minutes using distilled water, acetone, and isopropyl alcohol. Ultrasonic washing using isopropyl alcohol decreases a surface energy on a substrate and increases wetting property. Then, the glass was washed again for 15 minutes using UV-ozone. UV-ozone washing increases an oxygen bonding density of a surface to change a surface energy. Poly(3,4-ethylenedioxythiophene: poly(styrenesulfonate) (PEDOT:PSS, Baytron P, AL4083) having high conductivity was spin-coated at 5000 rpm for 40 seconds, and left at 120 for 10 minutes. An activated layer contained a mixture of copolymer which is an electron donor and [60]PCBM which is an electron acceptor, which is prepared from 1:1 wt % solution (12 mg/mL) in chlorobenzene and the mixture prepared from the solution was spin-coated at 2000 rpm. A coating thickness was measured by using surface profiler (NanoMap 500LS). Al (100 nm) cathode was evaporated by heat in vacuum (<5×10-7 torr) through a shadow mask. A thermal annealing was performed in a scheme in which the apparatus was directly put onto a hot plate in a glove box under nitrogen atmosphere for 10 minutes. Current-voltage (1-V) property was recorded using Keithley 2420 Source meter with illumination from AM 1.5G (AM=air mass) Solar Simulator (Model Sol3A, Oriel) with a strength of 100 mW/cm$^2$. All apparatuses were manufactured under nitrogen atmosphere without oxygen and moisture in a glovebox to be tested.

2,5-bis(tributylstannyl)-3,4-ethylenedioxythiophene (6)

EDOT (5, 1.42 g, 10 mmol) was dissolved into anhydrous THF (40 ml) and cooled to 0. After stirring at 0 for 15 minutes, LDA (15 mL, 2M, THF/heptane/ethylebenzene) was added for 15 minutes, and after addition was complete, a reaction mixture was heated to room temperature for 1 hour. The reaction mixture was cooled to 0 and tributylstannyl chloride (8.1 ml, 30 mmol) was added thereto, followed by stirring at 0 for 1 hour, and water ethylacetate were added thereto. An organic layer was separated from the reactant and the separated organic layer was washed with water and lastly dried with anhydrous sodium sulfate. The solvent was evaporated under reduced pressure, and thus-obtained residues were purified by flash chromatography using hexane as eluent in silica gel pre-treated with triethylamine to obtain a colorless oil 6 (6.61 g, 92%). $^1$H NMR (CDCl$_3$, 400 MHz, d/ppm): 4.03-4.02 (d, J=4 Hz, 4H$_2$OCH$_2$CH$_2$O), 1.60-1.40 (m, 12, 2×Sn—(CH$_2$—)$_3$), 1.26-1.20 (m, 12H, 2×Sn—(CH$_2$CH$_2$—)$_3$), 1.00 (m, 12H, 2×Sn—(CH$_2$CH$_2$CH$_2$—)$_3$), 0.83-0.79 (m, 18H, 2×(CH$_3$)$_3$). $^{13}$C NMR (CDCl$_3$, 100 MHz, d/ppm): 148.29, 115.81, 64.62, 29.01, 27.20, 13.69, 10.48. C$_{30}$H$_{58}$O$_2$SSn$_2$ (720.27): Theoretical value C, 50.03; H, 8.12; S, 4.45; Sn, 32.96; Experimental value C, 50.18; H, 8.08; S, 4.39.

5.5-bis(3,4-ethylenedioxythiophene (7)

THF 150 mL and EDOT (5, 4.26 g, 30 mmol) solution were added into a three-neck round bottom and cooled to −80, followed by adding n-BuLi (12 mL, 2.5M, hexane) for 30 minutes. The reaction mixture was stirred for 45 minutes, and CuCl$_2$ 4.03 g (30 mmol) was added at once at the same temperature. A temperature of the reaction mixture was increased to −40, followed by stirring for 2 hours, and water was added and filtered. The green precipitate was clearly washed with pentane, an organic layer was separated therefrom, and the separated organic layer was clearly washed with water and dried with anhydrous sodium sulfate. The solvent was concentrated under reduced pressure, a crude solid was dissolved into chloroform, and dry flash silica column chromatography using chloroform as an eluent was performed to obtain a desired product 7 (6.43 g, 760). $^1$H NMR (CDCl$_3$, 400 MHz, d/ppm): 6.26 (s, 2H, 2×CHS), 4.32-4.31 (d, J=4 Hz, 4H$_2$OCH$_2$CH$_2$O), 4.24-4.23 (d, J=4 Hz, 4H, OCH$_2$CH$_2$O). $^{13}$C NMR (CDCl$_3$, 100 MHz, d/ppm): 141.22, 137.02, 109.89, 97.52, 64.98, 64.59. C$_{12}$H$_{10}$O$_4$S$_2$ (282.34): C, 51.05; H, 3.57; S, 22.71; Experimental value C, 51.00; H, 3.64; S, 22.80.

Reaction of 5,5'-bis(3,4-ethylenedioxythiophene (7) and tributyltin chloride

This reaction was performed by modification of a known method (16b,c). After Bis-EDOT (7, 2.4 g, 8.50 mmol) was added to anhydrous THF (100 mL) and cooled to −80, n-BuLi (8.5 mL, 21.25 mmol, 2.5M, hexane) was added thereto for 30 minutes. The reaction mixture was stirred at −80 for 1 hour, and tributyltin chloride (6 mL, 21.25 mmol) was added to the reaction mixture over 15 minutes. After the mixture was stirred at −80 for 30 minutes, temperature of the reaction mixture was increased to room temperature, and the mixture was further stirred for 2 hours, followed by quenching the reactant with NH$_4$Cl aqueous solution. The reaction mixture was extracted with ethylacetate, and an organic layer was washed with water and dried with anhydrous sodium sulfate. The solvent was evaporated, and a crude mixture of the product was purified with silica gel flash column chromatography pre-treated with triethylamine, thereby obtaining desired products 8 and 9.

5-tributylstannyl-2,2'-bis(3,4-ethylenedioxythiophene)(8)

(Yellow Solid; 1.69 g, 23%) $^1$H NMR (CDCl$_3$, 400 MHz, d/ppm): 6.22 (s, 1H, CHS), 4.29-4.16 (m, 8H, 2×OCH$_2$CH$_2$O), 1.60-1.45 (m, 6H, 3×CH$_3$CH$_2$CH$_2$CH$_2$), 1.34-1.30 (m, 6H, 3×CH$_3$CH$_2$CH$_2$), 1.13-1.11 (m, 6H, 3×CH$_3$CH$_2$), 0.91-0.87 (t, J=16 Hz, 9H, 3×CH$_3$). $^{13}$C NMR (CDCl$_3$, 100 MHz, d/ppm): 147.06, 141.13, 137.68, 136.69, 115.52, 110.43, 106.80, 96.90, 64.88, 64.48, 28.96, 27.04, 13.58, 10.48. C$_{24}$H$_{36}$O$_4$S$_2$Sn (571.38): Theoretical value C, 50.45; H, 6.35; S, 11.22; Sn, 20.78; Experimental value C, 50.40; H, 6.39; S, 11.19.

5.5-tributylstannyl-2,2'-bis(3,4-thylenedioxythiophene)(9)

(Light Yellow Solid; 4.58 g, 75%). $^1$H NMR (CDCl$_3$, 400 MHz, d/ppm): (16b) 4.29-4.28 (d, J=4 Hz, 4H$_2$OCH$_2$CH$_2$O), 4.18-4.17 (d, J=4 Hz, 4H$_2$OCH$_2$CH$_2$O), 1.60-1.50 (m, 12H, 6×CH$_3$CH$_2$CH$_2$CH$_2$—), 1.33-1.31 (m, 12H, 6×CH$_3$CH$_2$CH$_2$—)$_3$), 1.12-1.02 (m, 12H, 6×CH$_3$CH$_2$—), 0.90-0.86 (t, J=16 Hz, 18H, 6×CH$_3$). $^{13}$C NMR (CDCl$_3$, 100 MHz, d/ppm): 147.17, 137.59, 116.23, 106.28, 64.92, 64.44, 28.95, 27.14, 13.67, 10.54. C$_{36}$H$_{62}$O$_4$S$_2$Sn$_2$ (860.43): Theoretical value C, 50.25; H, 7.26; S, 7.45; Sn, 27.59; Experimental value C, 50.35; H, 7.33; S, 7.37.

2,5-dibromo-3,4-dinitrothiophene (11)

A mixture of concentrated sulfuric acid (12.4 mL), fuming sulfuric acid (19.1 mL), fuming nitric acid (10.5 mL) was added into a three-neck flask dried under high vacuum and cooled in an ice bath, and 2,5-dibromothiophene (10, 3.35 mL, 7.2 g, 29.7 mmol) was added thereto while maintaining a temperature of 15. After the addition was complete, the reaction mixture was further stirred at 25 to 30 for 3 hours, and 100 g of ice was added thereto. When ice melted, yellow solid residue was vacuum filtered, collected, and recrystallized with methanol (5.0 g, 51%). $^{13}$C NMR (CDCl$_3$, 100 MHz, d/ppm): 140.66, 113.46. C$_4$Br$_2$N$_2$O$_4$S (331.93): Theoretical value C, 14.47; Br, 48.15; N, 8.44; S, 9.66; Experimental value C, 14.43; Br, 48.31; N, 8.37; S, 9.72.

3,4-diaminothiophene dihydrochloride (12)

Concentrated HCl (230 mL) and 2,5-dibromo-3,4-dinitrothiophene (11, 12.8 g, 38.0 mmol) were added into a flask, cooled in an ice bath, and mixed together. A metal tin was slowly added for 1 hour while maintaining a temperature of 25 to 30. After the addition was complete, the reactant was stirred until tin was consumed, and stored in a fridge for one night. A solid precipitate was vacuum filtered, collected and washed with diethylether and acetonitrile. The product 2H+ salt 12 is significantly stable; however, a free-amino product is significantly sensitive to oxidation. Due to the above reason, this precursor was generally stored as the product 2H+ salt. In the case of conversion to free-diaminothiophene, the product 2H+ salts was dissolved into water of 600 mL and cooled in an ice bath. This solution was basified with 4N Na$_2$CO$_3$, extracted with diethylether, dried with anhydrous sodium sulfate, followed by concentration in a rotary evaporator, thereby obtaining 3,4-diaminothiophene as white crystalline product (2.6 g, 61%). $^1$H NMR (CDCl$_3$, 400 MHz, d/ppm): 6.16 (s, 2H, 2×CRS), d 3.36 (s, br, 4H, 2×NH$_2$). $^{13}$C NMR (CDCl$_3$, 100 MHz, d/ppm): 137.2, 101.7. C$_4$H$_6$N$_2$S (114.17): Theoretical value C, 42.08; H, 5.30; N, 24.54; S, 28.09; Experimental value C, 42.18; H, 5.50; N, 24.66; S, 27.92.

Thieno[3,4-b]pyrazine (13)

3,4-diaminothiophene dihydrochloride (12, 1.03 g, 5.52 mmol) was added into 5% aqueous Na$_2$CO$_3$(60 mL). An glyoxal aqueous solution (0.36 g, 6.1 mmol) prepared by diluting 40% glyoxal solution (0.885 g) with water (15 mL) was added to the reactant for 5 minutes. The reaction mixture was stirred at room temperature for at least 3 hours, and extracted with ether and/or ethylacetate several times. A collected organic layer was washed with water and dried with anhydrous sodium sulfate, followed by concentration in a rotary evaporator, thereby obtaining a light brown oil. An assay sample was prepared by dissolving the oil into a small amount of CH$_2$Cl$_2$ and purified with column chromatography using hexane as an eluent, thereby obtaining 13 (0.57 g, 76%) as a light brown oil. $^1$H NMR (CDCl$_3$, 400 MHz, d/ppm): 8.51 (s, 2H, N=CHCH=N), 8.03 (s, 2H, 2×CH—S). $^{13}$C NMR (CDCl$_3$, 100 MHz, d/ppm): 144.41, 142.80, 118.00. C$_6$H$_4$N$_2$S (136.17): Theoretical value C, 52.92; H, 2.96; N, 20.57; S, 23.55; Experimental value C, 53.07; H, 3.11; N, 20.50; S, 23.63.

5,7-dibromothiono[3,4-b]pyrazine (14)

After Thieno[3,4-b]pyrazine (13, 2.0 g, 14.7 mmol) was added into chloroform/acetic acid (1:1; 60 mL) and a temperature was decreased to 0, NBS (5.75 gm, 32.3 mmol) was divided three times and separately added, three times. The reaction mixture was stirred at room temperature for one night, and water in the same amount was added to the reaction mixture. The reaction mixture was washed with water, and chloroform layer was separated from the mixture and dried with anhydrous Na$_2$SO$_4$. An organic layer was evaporated under reduced pressure without heating, thereby obtaining green and yellow solid. A crude solid reactant was washed with ether several times (decantation until ether is colorless). The reactant was further purified with silica flash column chromatography (hexane/CH$_2$Cl$_2$; 1:1) to obtain a pure product 14 as a yellow solid (1.62 g, 750). $^1$H NMR (CDCl$_3$, 400 MHz, d/ppm): 8.53 (s, 2H, N=CHCH=N). $^{13}$C NMR (CDCl$_3$, 100 MHz, d/ppm): 145.61, 140.60, 105.78. C$_6$H$_2$Br$_2$N$_2$S (293.97): Theoretical value C, 24.51; H, 0.69

General Method for Stille Cross Coupling Polymerization Using Microwave

After desired dibromo- and di-tributylstannyl derivatives (0.5 mmol) were dissolved into anhydrous DMF at an equivalent molar ratio in a glass tube having a well-dried screw lid, air was removed by nitrogen for at least 30 minutes, and Pd(PPh)$_4$(5 mol %, in proportion to Br) was added thereto. The tube sealed with a lid was put into a microwave reactor and was irradiated under the same condition; at 100 5 minutes, at 120 5 minutes, at 150 30 minutes. An end sealing procedure were performed by two stages. First, phenylboronic acid pinacol ester was used, and bromobenzene was used to seal the end. End sealing condition is as follows: at 100 2 minutes, at 120 2 minutes, and finally at 150 5 minutes. After final end sealing process, the microwave screw-sealed glass tube was heated at room temperature, and the reaction mixture was poured into methanol. After a crude polymer was filtered and collected, the reactant was washed with methanol. After residual solid was loaded into an extraction thimble, the reactant was washed with methanol for 24 hours and then washed with acetone for 24 hours, and dried in vacuum, followed by performing GPC and $^1$H NMR analysis.

Note: All copolymers except for P3 and P6 were prepared under the above-described microwave conditions, and P3 and P6 were prepared in the following microwave conditions. At 80 5 minutes, at 100 5 minutes, at 130 15 minutes; the end sealing method is the same as described above.

Synthesis of P1 Using Thermal CH-Arylation:

25 mL round flask having 3-way stopcock was heated under reduced pressure, and cooled at room temperature under argon atmosphere. 1 (0.16 g, 0.25 mmol) and EDOT (5, 0.04 g, 0.25 mmol) were added to the flask at the equivalent molar ratio, respectively, and dissolved into anhydrous DMF (20 mL), and purged with nitrogen for 20 minutes. Potassium acetate (0.15 g, 1.56 mmol, 6.0 equivalent), TBAB (0.16 g, 0.5 mmol, 2.0 equivalent) and Pd(OAc)$_2$ (0.01 g, 0.05 mmol, 0.2 equivalent) was added under nitrogen atmosphere and the reaction mixture was purged for 20 minutes. The reaction mixture was heated and refluxed at 100 and stirred for 72 hours. End sealing was performed using phenylboronic acid pinacol ester in a single stage. End sealing condition is as follows: At 100 2 minutes, at 120 2 minutes, finally at 150 5 minutes, and a temperature was increased to room temperature and the reaction mixture was poured into methanol. After the crude compound was filtered and collected, the reactant compound was continuously washed with methanol. After the residual solid was loaded into an extraction thimble, the reactant was washed with methanol for 48 hours and then washed with acetone for 48 hours. Then, after the obtained polymer (P1) was dried in vacuum, GPC and $^1$H NMR analysis were performed (Mn=3393 and PDI=3.82).

General Method for Microwave-Assisted CH-Arylation Polymerization (Synthesis of P1, P2, P4 and P5)

Desired dibromo- and unsubstituted EDOT derivative (0.5 mmol) was dissolved into anhydrous DMF (20 mL) at an equivalent molar ratio in a glass tube having a well-dried screw lid, and purged with nitrogen for 20 minutes. Potassium acetate (6.0 equivalent), tetrabutylammonium bromide (TBAB; 2.0 equivalent) and Pd(OAc)2 (0.2 equivalent) were added thereto under nitrogen. The tube sealed with the lid was put into a microwave reactor, and was irradiated under the same condition: At 100 for 5 minutes, at 120 for 5 minutes, at 150 for 40 minutes. The glass tube having the microwave screw lid was heated to room temperature, and the reaction mixture was poured into methanol. After a crude polymer was filtered and collected, the reactant was washed with methanol. After residual solid was loaded into an extraction thimble, the reactant was washed with methanol for 48 hours and then washed with acetone for 48 hours, and dried in vacuum, followed by performing GPC and $^1$H NMR analysis.

Chemical yield, average molecular weight (Mn) and molecular weight distribution (PDI; M w/M n) of all copolymers were summarized in Table 1.

poly[(3,4-ethylenedioxythiophene-5,7-diyl)-alt-(4,7-bis(3-hexylthiophene-2-yl)benzo[c][2,1,3]thiadiazole)-5,5-diyl] (P1)

$^1$H NMR (CDCl$_3$, 400 MHz, d/ppm): 7.67-7.65 (s, br, 2H, CHCH(Ph)), 7.23 (s, 2H, 2×CH=C—S), 4.42 (s, br, 4H$_2$OCH$_2$CH$_2$O), 2.69 (t, 4H, 2×ArCH$_2$CH$_2$—), 1.67 (t, 4H, 2×ArCH$_2$CH$_2$—), 1.29-1.10 (m, 12H, 2×CH$_3$(CH$_2$)$_3$), 0.85-0.80 (t, 6H, 2×CH$_3$). (C$_{32}$H$_{34}$N$_2$O$_2$S$_4$)$_n$ (606.88)$_n$: Theoretical value C, 63.33; H, 5.65; N, 4.62; S, 21.13; Experimental value C, 63.55; H, 5.59; N, 4.70; S, 21.21.

poly[(bis(3,4-ethylenedioxythiophene-5',7-diyl)-alt-(4,7-bis(3-hexylthiophene-2-yl)benzo[c][2,1,3]thiadiazole)-5,5-diyl] (P2)

$^1$H NMR (CDCl$_3$, 400 MHz, d/ppm): 7.68-7.64 (s, br, 2H, CHCH (Ph)), 7.26 (s, 2H, 2×CH=C—S), 4.34-4.39 (s, br, 8H, 2 XOCH$_2$CH$_2$O), 2.68-2.64 (t, 4H, 2×ArCH$_2$CH$_2$), 1.67-1.66 (t, 4H, 2×ArCH$_2$CH$_2$—), 1.27-1.24 (m, 12H, 2×CH$_3$(CH$_2$)$_3$), 0.85-0.82 (t, 6H, 2×CH$_3$). (C$_{38}$H$_{38}$N$_2$O$_4$S$_5$)$_n$ (747.04)$_n$: Theoretical value C, 61.09; H, 5.13; N, 3.75; O, 8.57; S, 21.46; Experimental value C, 61.00; H, 5.22; N, 3.70; S, 21.56.

poly[(thieno[3,4-b]pyrazine-5,7-diyl)-alt-(4,7-bis(3-hexylthiophene-2-yl)benzo[c][2,1,3] thiadiazole)-5, 5-diyl] (P3)

$^1$H NMR (CDCl$_3$, 400 MHz, d/ppm): 8.54-8.53 (s, 2H, N=CH$_2$—CH$_2$=N), 7.76 (s, br, 2H, CHCH(Ph)), 7.68 (s, 2H, 2×CH=C—S), 2.77-2.73 (t, 4H, 2×Ar—CH$_2$CH$_2$), 1.73-1.71 (t, 4H, 2×Ar—CH$_2$CH$_2$—), 1.33-1.20 (m, 12H, 2×CH$_3$(CH$_2$)$_3$), 0.92-0.83 (t, 6H, 2×CH$_3$). (C$_{32}$H$_{32}$N$_4$S$_4$)$_n$ (600.88)$_n$: Theoretical value C, 63.96; H, 5.37; N, 9.32; S, 21.35; Experimental value C, 64.11; H, 5.48; N, 9.38; S, 5.40.

poly[(3,4-ethylenedioxythiophene-5,7-diyl)-alt-(4,7-bis(4-hexylthiophene-2-yl)benzo[c][2,1,3]thiadiazole)-5,5-diyl] (P4)

$^1$H NMR (CDCl$_3$, 400 MHz, d/ppm): 8.05-8.03 (m, 2H, CHCH (Ph)), 7.85-7.83 (s, br, 2H, 2×CH=C-Ph), 4.43 (s, 4H$_2$OCH$_2$CH$_2$O), 2.89-2.68 (m, 4H, 2×ArCH$_2$CH$_2$—), 1.77-1.70 (t, 4H, 2×Ar—CH$_2$CH$_2$—), 1.46-1.31 (m, 12H, 2×CH$_3$(CH$_2$)$_3$), 0.91-0.86 (t, 6H, 2×CH$_3$). (C$_{32}$H$_{34}$N$_2$O$_2$S$_4$)$_n$ (606.88)$_n$: Theoretical value C, 63.33; H, 5.65; N, 4.62; O, 5.27; S, 21.13; Experimental value C, 63.25; H, 5.75; N, 4.60; S, 21.08.

poly[bis(3,4-ethylenedioxythiophene-5',7-diyl)-alt-(4,7-bis(4-hexylthiophene-2-yl)benzo[c][2,1,3]thiadiazole)-5,5-diyl] (P5)

$^1$H NMR (CDCl$_3$, 400 MHz, d/ppm): 8.06-8.02 (m, 2H, CHCH (Ph)), 7.81-7.80 (s, br, 2H, 2×CH=C-Ph), 4.39-4.25 (s, br, 8H, 2×OCH$_2$CH$_2$O), 2.85-2.68 (t, 4H, ArCH$_2$CH$_2$—), 1.77-1.70 (t, 4H, 2×ArCH$_2$CH$_2$—), 1.42-1.25 (m, 12H, 2×CH$_3$(CH$_2$)$_3$), 0.89-0.84 (t, 6H, 2×CH$_3$). (C$_{38}$H$_{38}$N$_2$O$_4$S$_5$)$_n$ (747.04)$_n$: Theoretical value C, 61.09; H, 5.13; N, 3.75; S, 21.46; Experimental value C, 61.25; H, 5.05; N, 3.84; S, 21.40.

poly[(thieno[3,4-b]pyrazine-5,7-diyl)-alt-(4,7-bis(4-hexylthiophene-2-yl)benzo[c][2,1,3]thiadiazole)-5,5-diyl(P6)

$^1$H NMR (CDCl$_3$, 400 MHz, d/ppm): 8.62 (s, br, 2H, N=CH$_2$CH$_2$=N), 8.07-7.98 (s, br, 2H, CHCH(Ph)), 7.85-7.82 (s, br, 2H, 2×CH=C-Ph), 2.99-2.68 (t, 4H, 2×ArCH$_2$CH$_2$—), 1.85-1.25 (m, br, 16H, 2×Ar—CH$_2$(CH$_2$)$_4$—), 0.90-0.86 (t, 6H, 2×CH$_3$). (C$_{32}$H$_{32}$N$_4$S$_4$)$_n$ (600.88)$_n$: Theoretical value C, 63.96; H, 5.37; N, 9.32; S, 21.35; Experimental value C, 63.88; H, 5.47; N, 9.30; S, 21.24.

[Industrial Applicability]

The copolymer according to the present invention may be used as the π-conjugated copolymer having a low band gap for a photovoltaic cell, and the copolymer may be easily and effectively prepared according to the preparing method of the copolymer according to the present invention. As a result, the copolymer according to the present invention may be a promising candidate for an active material used in most organic photovoltaic cells and optoelectronic devices due to thermally, optically, and electrochemically excellent properties.

The invention claimed is:

1. A copolymer represented by the following Chemical Formula 3:

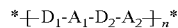  [Chemical Formula 3]

in Chemical Formula 3,

-D$_1$-, and -D$_2$- are the same or different and each independently selected from

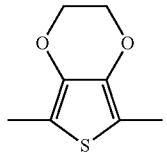 and 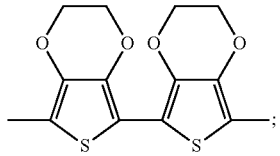 ;

-A1- and -A2- are different and each independently selected from

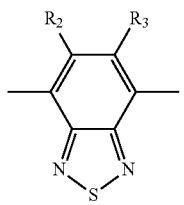 and 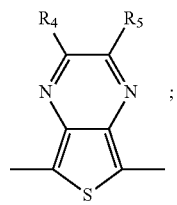 ;

—R$_2$, —R$_3$, —R$_4$ and —R$_5$ are the same or different and each independently —H, C1-C12 alkyl, C1-C12 alkoxy, or phenyl group; and n is an integer of 10 to 10,000.

2. A dye-sensitized solar cell comprising the copolymer of claim 1.

3. An organic thin film transistor comprising the copolymer of claim 1.

4. A copolymer represented by the following Chemical Formula 1:

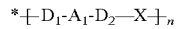  [Chemical Formula 1]

in Chemical Formula 1, wherein D$_1$ and D$_2$ are different —X— is -D$_3$- or -A$_2$-;

-D$_1$-, -D$_2$- and -D$_3$- are each independently selected from

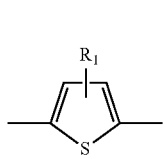 , 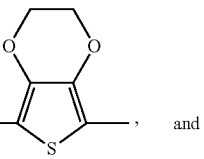 and

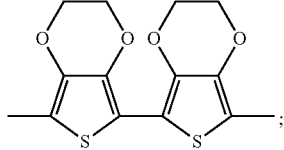 ;

—R$_1$ is C1—C12 alkyl, C1-C12 alkoxy, amine, phenyl group; -A1- and -A2- are the same or different and each independently selected from

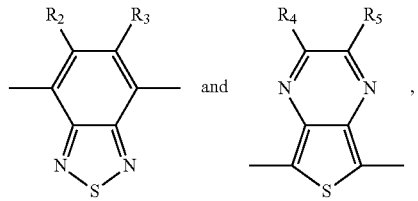

and at least one of -A1- or -A2- comprises

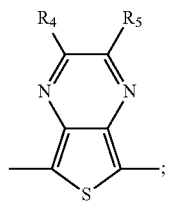 ;

—R$_2$, —R$_3$, —R$_4$ and —R$_5$ are the same or different and each independently —H, C1-C12alkyl, C1—C12 alkoxy, or phenyl group; and n is an integer of 10 to 10,000.

5. The copolymer of claim 4, wherein it is represented by the following Chemical Formula 3:

  [Chemical Formula 3]

in Chemical Formula 3,

A$_2$ is different from A$_1$.

6. A dye-sensitized solar cell comprising the copolymer of claim 4.

7. An organic thin film transistor comprising the copolymer of claim 4.

8. A copolymer represented by the following Chemical Formula 1:

  [Chemical Formula 1]

in Chemical Formula 1, wherein D$_1$ and D$_2$ are different —X— is -D$_3$- or -A$_2$-;

-D$_1$-, -D$_2$- and -D$_3$- are each independently selected from

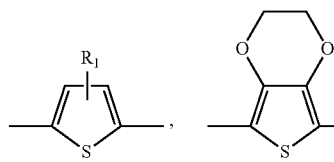 , and

 ;

—R$_1$ is C1-C12 alkyl, C1-C12 alkoxy, amine, phenyl group; -A1- and -A2- are different and each independently selected from

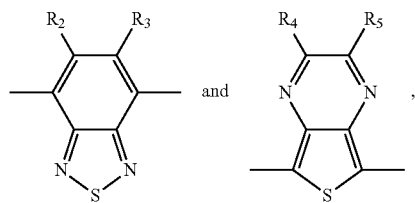

—$R_2$, —$R_3$, —$R_4$ and —$R_5$ are the same or different and each independently -H, C1-C12alkyl, C1—C12 alkoxy, or phenyl group; and n is an integer of 10 to 10,000.

9. The copolymer of claim 8, wherein it is represented by the following Chemical Formula 3:

*$\{$-$D_1$-$A_1$-$D_2$-$A_2$-$\}_n$*      [Chemical Formula 3]

in Chemical Formula 3.

10. A dye-sensitized solar cell comprising the copolymer of claim 8.

11. An organic thin film transistor comprising the copolymer of claim 8.

\* \* \* \* \*